United States Patent
Kakita et al.

(10) Patent No.: US 11,595,019 B2
(45) Date of Patent: Feb. 28, 2023

(54) ACOUSTIC WAVE RESONATOR, FILTER, AND MULTIPLEXER

(71) Applicant: TAIYO YUDEN CO., LTD., Tokyo (JP)

(72) Inventors: Naoki Kakita, Tokyo (JP); Osamu Kawachi, Tokyo (JP); Rei Oikawa, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 1000 days.

(21) Appl. No.: 16/375,512

(22) Filed: Apr. 4, 2019

(65) Prior Publication Data

US 2019/0326878 A1    Oct. 24, 2019

(30) Foreign Application Priority Data

Apr. 20, 2018  (JP) .............................. JP2018-081065
May 17, 2018  (JP) .............................. JP2018-095422

(51) Int. Cl.
*H03H 9/02*        (2006.01)
*H01L 41/047*      (2006.01)
(Continued)

(52) U.S. Cl.
CPC ....... *H03H 9/02574* (2013.01); *H01L 41/047* (2013.01); *H01L 41/083* (2013.01);
(Continued)

(58) Field of Classification Search
CPC .. H03H 9/02574; H03H 9/02559; H03H 3/08; H01L 41/047; H01L 41/083
(Continued)

(56) References Cited

U.S. PATENT DOCUMENTS 5,757,250 A * 5/1998 Ichikawa ............. H03H 9/1071
                                                         310/313 A
5,814,917 A * 9/1998 Isobe ................. H03H 9/02559
                                                         310/313 R
(Continued)

FOREIGN PATENT DOCUMENTS

JP         2005-252550 A    9/2005
JP         2017-34363 A     2/2017
(Continued)

OTHER PUBLICATIONS

Notice of Reasons for Refusal dated Oct. 5, 2021, issued by the Japanese Patent Office in corresponding application JP 2018-081065.
(Continued)

*Primary Examiner* — Derek J Rosenau
(74) *Attorney, Agent, or Firm* — Stein IP, LLC

(57) ABSTRACT

An acoustic wave resonator includes: a support substrate; a piezoelectric substrate located on the support substrate; a first amorphous layer that is in contact with the support substrate and is mainly composed of one or more constituent elements of the support substrate; a second amorphous layer that is in contact with the piezoelectric substrate and the first amorphous layer, is mainly composed of one or more constituent elements of the piezoelectric substrate, and is thinner than the first amorphous layer; and a pair of comb-shaped electrodes that is located on an opposite surface of the piezoelectric substrate from the support substrate, each of the pair of comb-shaped electrodes including electrode fingers.

10 Claims, 21 Drawing Sheets

(51) Int. Cl.
*H01L 41/08* (2006.01)
*H01L 41/083* (2006.01)
*H03H 3/08* (2006.01)
*H01L 41/312* (2013.01)

(52) U.S. Cl.
CPC ............. *H01L 41/312* (2013.01); *H03H 3/08* (2013.01); *H03H 9/02559* (2013.01); *H03H 9/02834* (2013.01)

(58) Field of Classification Search
USPC ...... 310/313 R, 313 A, 313 B, 313 C, 313 D
See application file for complete search history.

(56) References Cited

U.S. PATENT DOCUMENTS

| | | | |
|---|---|---|---|
| 8,901,803 B2 | 12/2014 | Hori et al. | 310/358 |
| 8,907,547 B2 | 12/2014 | Tai et al. | 310/313 |
| 9,431,996 B2 | 8/2016 | Watanabe et al. | 310/313 |
| 9,484,885 B2 | 11/2016 | Watanabe et al. | 3/2 |
| 9,831,848 B2 | 11/2017 | Watanabe et al. | |
| 2005/0194864 A1* | 9/2005 | Miura | H03H 9/02574 310/313 R |
| 2015/0028720 A1* | 1/2015 | Kando | H01L 41/29 156/230 |
| 2017/0033765 A1 | 2/2017 | Moriya et al. | |
| 2018/0159494 A1 | 6/2018 | Goto et al. | |
| 2019/0036505 A1* | 1/2019 | Akiyama | H03H 9/25 |

FOREIGN PATENT DOCUMENTS

| | | |
|---|---|---|
| JP | 2017-139720 A | 8/2017 |
| JP | 2018-74575 A | 5/2018 |

OTHER PUBLICATIONS

Notice of Reasons for Refusal dated Oct. 5, 2021, issued by the Japanese Patent Office in corresponding application JP 2018-095422.

* cited by examiner

SIMULATION A

SIMULATION B

ACOUSTIC WAVE RESONATOR, FILTER, AND MULTIPLEXER

CROSS-REFERENCE TO RELATED APPLICATION

This application is based upon and claims the benefit of priority of the prior Japanese Patent Application No. 2018-081065, filed on Apr. 20, 2018, and the prior Japanese Patent Application No. 2018-095422, filed on May 17, 2018, the entire contents of which are incorporated herein by reference.

FIELD

A certain aspect of the present invention relates to an acoustic wave resonator, a filter, and a multiplexer.

BACKGROUND

There have been known surface acoustic wave resonators as acoustic wave resonators used in communication devices such as smartphones. It has been known that a piezoelectric substrate forming a surface acoustic wave resonator is attached to a support substrate. It has been known that an amorphous layer is formed on the surfaces of the piezoelectric substrate and the support substrate, and the piezoelectric substrate and the support substrate are bonded together at normal temperature as disclosed in, for example, Japanese Patent Application Publication No. 2005-252550 (hereinafter, referred to as Patent Document 1). It has been known that the thickness of the piezoelectric substrate bonded at normal temperature is configured to be equal to or less than the wavelength of the surface acoustic wave as disclosed in, for example, Japanese Patent Application Publication No. 2017-034363 (hereinafter, referred to as Patent Document 2).

SUMMARY OF THE INVENTION

According to a first aspect of the present invention, there is provided an acoustic wave resonator including: a support substrate; a piezoelectric substrate located on the support substrate; a first amorphous layer that is in contact with the support substrate and is mainly composed of one or more constituent elements of the support substrate; a second amorphous layer that is in contact with the piezoelectric substrate and the first amorphous layer, is mainly composed of one or more constituent elements of the piezoelectric substrate, and is thinner than the first amorphous layer; and a pair of comb-shaped electrodes that is located on an opposite surface of the piezoelectric substrate from the support substrate, each of the pair of comb-shaped electrodes including electrode fingers.

According to a second aspect of the present invention, there is provided a filter including the above acoustic wave resonator.

According to a third aspect of the present invention, there is provided a multiplexer including the above filter.

DETAILED DESCRIPTION

When the piezoelectric substrate is bonded on the support substrate, the temperature characteristic of the surface acoustic wave resonator is improved. Furthermore, when the thickness of the piezoelectric substrate is equal to or less than the wavelength of the surface acoustic wave, spurious is reduced. However, reduction in loss is insufficient.

Hereinafter, a description will be given of embodiments of the present invention with reference to the accompanying drawings.

First Embodiment

Figure 1:
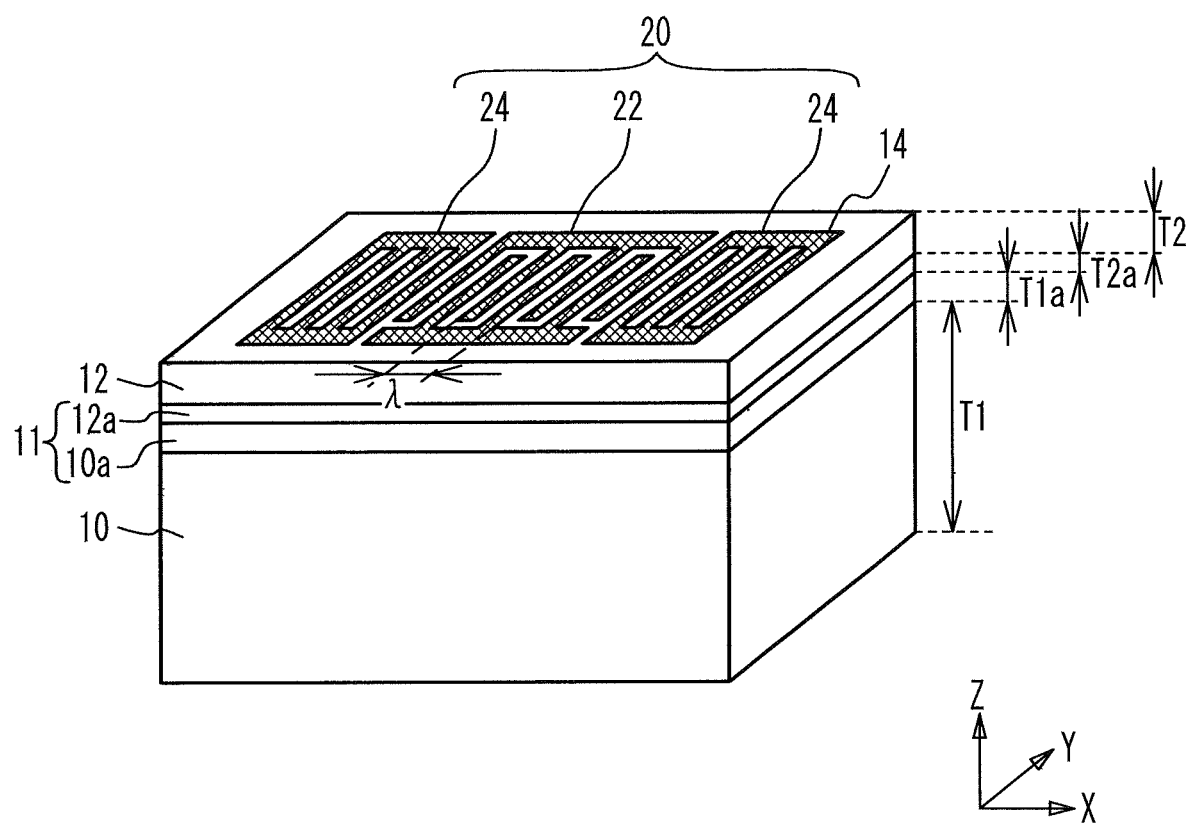
FIG. 1 is a perspective view of an acoustic wave resonator in accordance with a first embodiment.
Figure 2A:
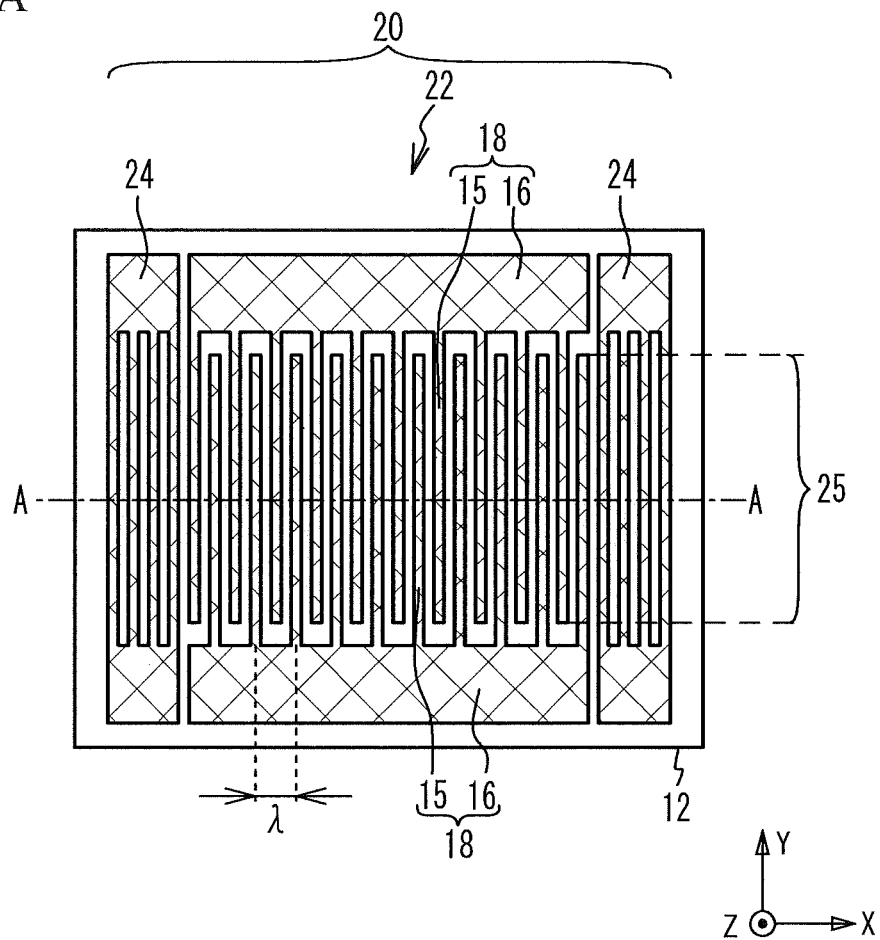
FIG. 2A is a plan view of the acoustic wave resonator in the first embodiment.
Figure 2B:
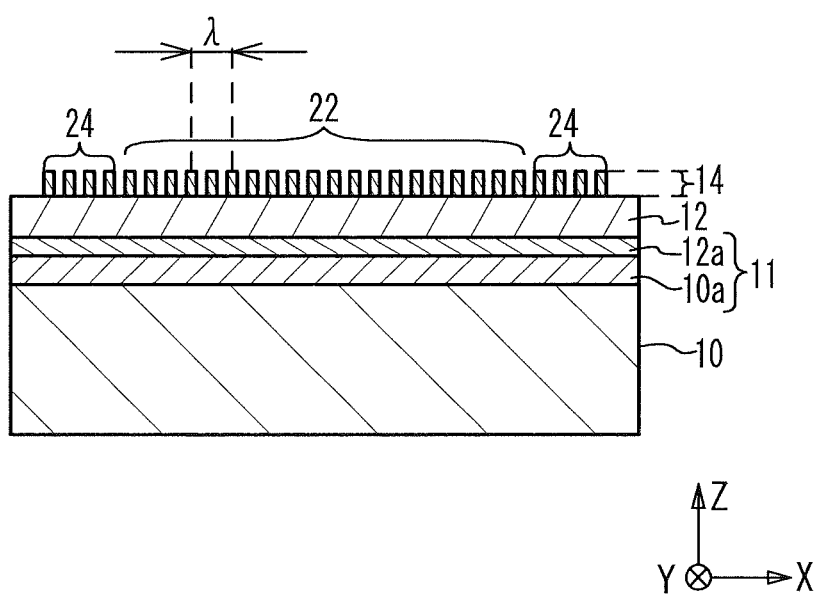
FIG. 2B is a cross-sectional view taken along line A-A in FIG. 2A.

FIG. 1 is a perspective view of an acoustic wave resonator in accordance with a first embodiment, FIG. 2A is a plan view of the acoustic wave resonator in the first embodiment, and FIG. 2B is a cross-sectional view taken along line A-A in FIG. 2A. The direction in which electrode fingers are arranged is defined as an X direction, the direction in which the electrode finger extends is defined as a Y direction, and the direction in which a support substrate and a piezoelectric substrate are stacked is defined as a Z direction. The X direction, the Y direction, and the Z direction do not necessarily correspond to the X-axis orientation and the Y-axis orientation of the crystal orientation of the piezoelectric substrate.

As illustrated in FIG. 1, FIG. 2A, and FIG. 2B, a piezoelectric substrate 12 is bonded on a support substrate 10. An amorphous layer 11 is located between the support substrate 10 and the piezoelectric substrate 12. The amorphous layer 11 includes amorphous layers 10a and 12a. The amorphous layer 10a is located on the support substrate 10, and is mainly composed of one or more constituent elements of the support substrate 10. The amorphous layer 12a is located on the lower surface of the piezoelectric substrate 12, and is mainly composed of one or more constituent elements of the piezoelectric substrate 12. The thicknesses of the support substrate 10, the amorphous layers 10a and 12a, and the piezoelectric substrate 12 are respectively represented by T1, T1a, T2a, and T2.

An acoustic wave resonator 20 is located on the piezoelectric substrate 12. The acoustic wave resonator 20 includes an IDT 22 and reflectors 24. The reflectors 24 are located at both sides of the IDT 22 in the X direction. The IDT 22 and the reflectors 24 are formed of a metal film 14 on the piezoelectric substrate 12.

The IDT 22 includes a pair of comb-shaped electrodes 18 facing each other. The comb-shaped electrode 18 includes a plurality of electrode fingers 15, and a bus bar 16 to which the electrode fingers 15 are coupled. The region where the electrode fingers 15 of a pair of the comb-shaped electrodes 18 overlap is an overlap region 25. The length of the overlap region 25 corresponds to an aperture length. A pair of the comb-shaped electrodes 18 are arranged so as to face each other so that the electrode fingers 15 of one of the comb-shaped electrodes 18 and the electrode fingers 15 of the other are substantially alternately arranged in at least a part of the overlap region 25. In the overlap region 25, the acoustic wave excited by the electrode fingers 15 mainly propagates in the X direction. The pitch of the electrode fingers 15 of one comb-shaped electrode 18 corresponds to the wavelength A of the acoustic wave. The pitch corresponds to the pitch of two electrode fingers 15. The reflectors 24 reflect the acoustic wave (the surface acoustic wave) excited by the electrode fingers 15 of the IDT 22. Accordingly, the acoustic wave is confined in the overlap region 25 of the IDT 22.

The piezoelectric substrate 12 is, for example, a monocrystalline (single-crystal) lithium tantalate ($TaLiO_3$) substrate or a monocrystalline lithium niobate ($NbLiO_3$) substrate, and is, for example, a rotated Y-cut X-propagation lithium tantalate substrate or a rotated Y-cut X-propagation lithium niobate substrate. The support substrate 10 is, for example, a sapphire substrate, a spinel substrate, a silicon substrate, a crystal substrate, a quartz substrate, or an alumina substrate. The sapphire substrate is a monocrystalline $Al_2O_3$ substrate, the spinel substrate is a polycrystalline $MgAl_2O_3$ substrate, the silicon substrate is a monocrystalline Si substrate, the crystal substrate is a monocrystalline $SiO_2$ substrate, the quartz substrate is a polycrystalline $SiO_2$ substrate, and the alumina substrate is an $Al_2O_3$ sintered body (sintered ceramics) substrate. The linear thermal expansion coefficient of the support substrate 10 in the X direction is less than the linear thermal expansion coefficient of the piezoelectric substrate 12 in the X direction. This configuration reduces the frequency temperature dependence of the acoustic wave resonator.

The metal film 14 is, for example, a film mainly composed of aluminum (Al) or copper (Cu), and is, for example, an Al film or a Cu film. An adhesion film such as a titanium (Ti) film or a chrome (Cr) film may be located between the electrode finger 15 and the piezoelectric substrate 12. The adhesion film is thinner than the electrode finger 15. An insulating film may be provided so as to cover the electrode finger 15. The insulating film functions as a protective film or a temperature compensation film.

The thickness T1 is, for example, 50 μm to 500 μm. The thickness T2 is, for example, 0.5 μm to 5 μm, and is, for example, equal to or less than the wavelength A of the acoustic wave. Each of the thicknesses T1a and T2a is, for example, 0.1 nm to 10 nm, and T2a<T1a.

Figure 3A:
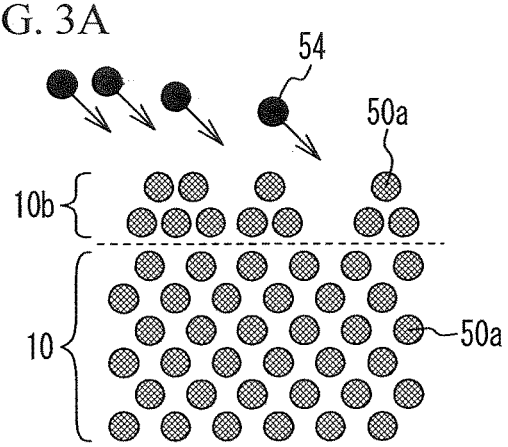
FIG. 3A through FIG. 3D are schematic views illustrating a method of bonding a support substrate and a piezoelectric substrate in the first embodiment.
Figure 3B:
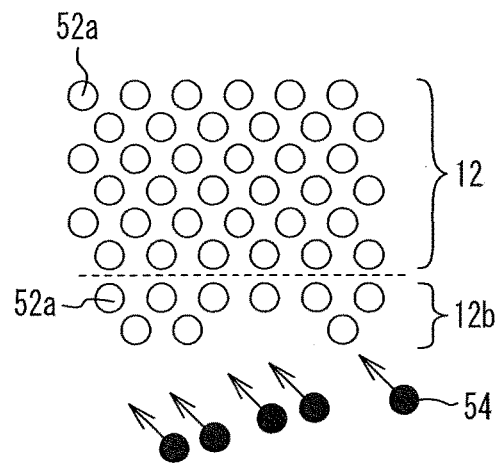

A description will be given of a method of bonding the lower surface of the piezoelectric substrate 12 to the upper surface of the support substrate 10. FIG. 3A through FIG. 3D are schematic views illustrating a method of bonding the support substrate and the piezoelectric substrate in the first embodiment. As illustrated in FIG. 3A, in the support substrate 10, atoms 50a of the elements constituting the support substrate 10 are regularly arranged. A natural oxide film 10b is formed on the upper surface of the support substrate 10. The natural oxide film 10b is composed of the atoms 50a and oxygen. As illustrated in FIG. 3B, in the piezoelectric substrate 12, atoms 52a of the elements constituting the piezoelectric substrate 12 are regularly formed. A natural oxide film 12b is formed on the lower surface of the piezoelectric substrate 12. The natural oxide film 12b is composed of the atoms 52a and oxygen.

As illustrated in FIG. 3A and FIG. 3B, in a vacuum, the upper surface of the support substrate 10 and the lower surface of the piezoelectric substrate 12 are irradiated with ions 54 or the like. The ion 54 is, for example, an ion of an inert element (for example, noble gases), such as an argon (Ar) ion. The ions 54 or the like are emitted as an ion beam, a neutralized beam, or plasma. This activates the upper surface of the support substrate 10 and the lower surface of the piezoelectric substrate 12. When an Ar ion is used, the current of the Ar ion is set at 25 mA to 200 mA, and the irradiation time of the Ar ion is set at approximately 30 seconds to 120 seconds, for example.

Figure 3C:
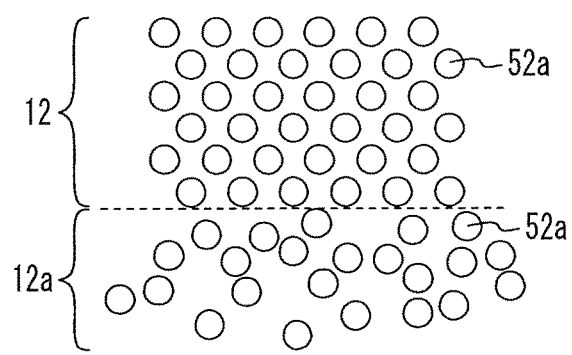
Figure 3C:
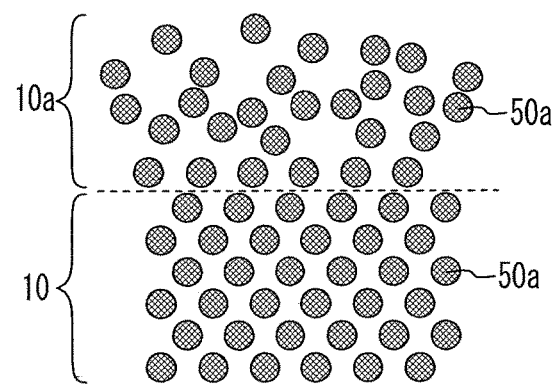

As illustrated in FIG. 3C, the amorphous layer 10a is formed on the upper surface of the support substrate 10, and the amorphous layer 12a is formed on the lower surface of the piezoelectric substrate 12. The amorphous layer 10a includes the atoms 50a of the constituent elements of the support substrate 10 and the ions 54. The amorphous layer 12a includes the atoms 52a of the constituent elements of the piezoelectric substrate 12 and the ions 54. Dangling bonds are formed on the surfaces of the amorphous layers 10a and 12a (i.e., the surfaces of the amorphous layers 10a and 12a are activated).

Figure 3D:
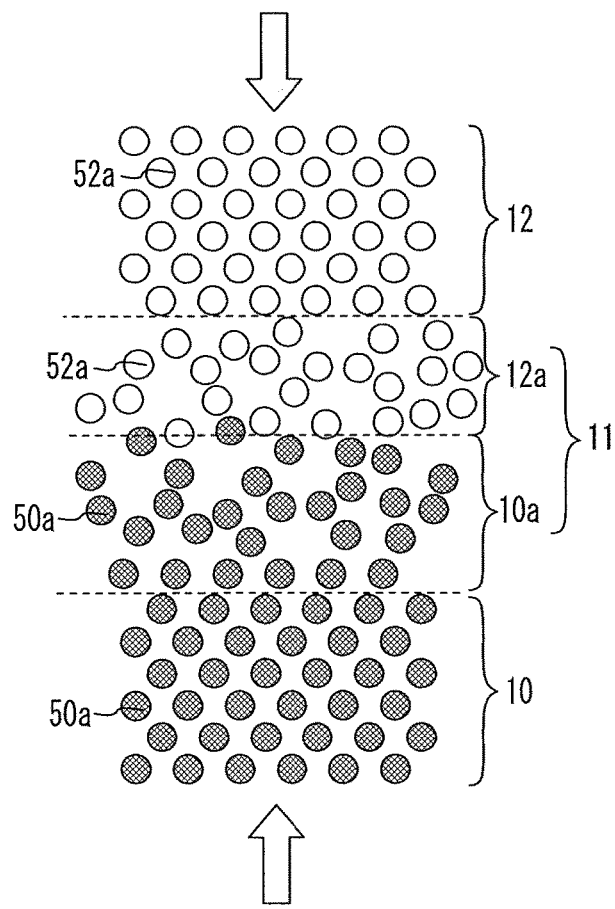

As illustrated in FIG. 3D, when the amorphous layers 10a and 12a are bonded to each other while a vacuum is maintained, the dangling bonds are bonded, and a strong bond is achieved. Accordingly, the support substrate 10 and the piezoelectric substrate 12 are bonded through the amorphous layer 11. Since the above-described bonding is conducted at normal temperature (for example, 100° C. or less and −20° C. or greater, preferably 80° C. or less and 0° C. or greater), a thermal stress is reduced.

When the support substrate 10 and the piezoelectric substrate 12 are bonded in the above-described manner, and the piezoelectric substrate 12 is a lithium tantalate substrate, the amorphous layer 12a is mainly composed of tantalum (Ta), lithium (Li), and oxygen (O), and contains Ar. When the piezoelectric substrate 12 is a lithium niobate substrate, the amorphous layer 12a is mainly composed of niobium (Nb), Li, and O, and contains Ar. The amorphous layer 12a contains almost no Al, Si, or Mg other than oxygen among the constituent elements of the support substrate 10.

When the support substrate 10 is a sapphire substrate or an alumina substrate, the amorphous layer 10a is mainly composed of Al and O, and contains Ar. When the support substrate 10 is a spinel substrate, the amorphous layer 10a is mainly composed of magnesium (Mg), Al, and O, and contains Ar. When the support substrate 10 is a silicon substrate, the amorphous layer 10a is mainly composed of silicon (Si), and contains Ar. When the support substrate 10 is a crystal substrate or a quartz substrate, the amorphous layer 10a is mainly composed of Si and O, and contains Ar. The amorphous layer 10a contains almost no Ta, Nb, and Li other than O among the constituent elements of the piezoelectric substrate 12.

Figure 4:
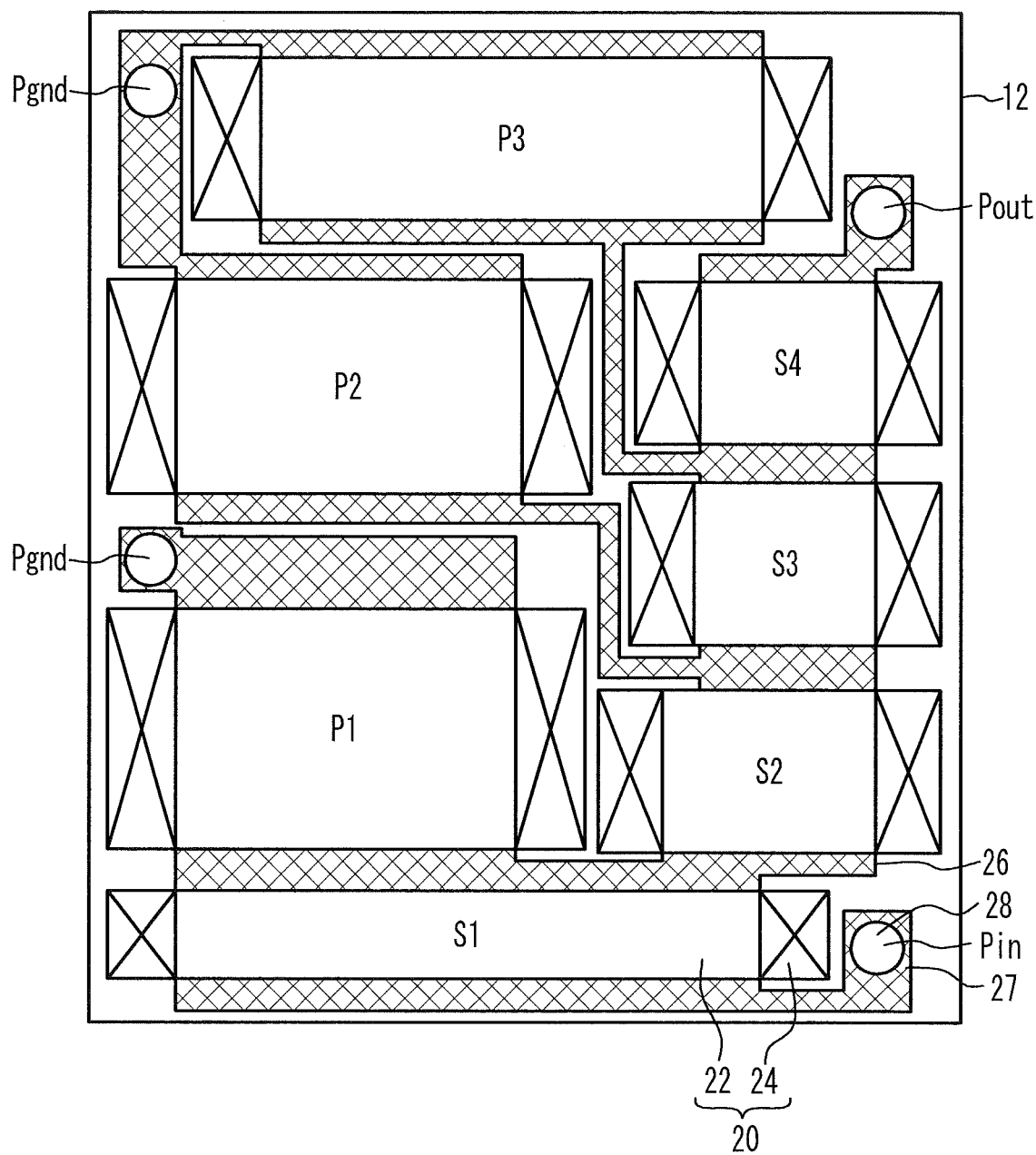
FIG. 4 is a plan view of a filter in the first embodiment.

FIG. 4 is a plan view illustrating a filter in the first embodiment. As illustrated in FIG. 4, the acoustic wave resonators 20, wiring lines 26, and pads 27 are located on the piezoelectric substrate 12. The acoustic wave resonators 20 include series resonators S1 through S4 and parallel resonators P1 through P3. The wiring lines 26 electrically connect between the acoustic wave resonators 20, and electrically connect the acoustic wave resonators 20 and the pads 27. Bumps 28 are formed on the pads 27. The pads 27 include an input pad Pin coupled to the input terminal, an output pad Pout coupled to the output terminal, and ground pads Pgnd coupled to the ground terminal. The series resonators S1 through S4 are connected in series between the input pad Pin and the output pad Pout through the wiring lines 26. The parallel resonators P1 through P3 are connected in parallel between the input pad Pin and the output pad Pout through the wiring lines 26. The number of the series resonators and the number of the parallel resonators can be freely designed. A ladder-type filter is described as the filter, but the filter may be a multimode type filter.

When the IDT 22 excites a surface acoustic wave, a bulk wave is excited in the piezoelectric substrate 12. The bulk wave reflected by the amorphous layer 11 causes spurious. In addition, the formation of the bulk wave causes the energy loss. Thus, as described in Patent Document 2, the thickness T2 of the piezoelectric substrate 12 is configured to be less than the wavelength A of the acoustic wave. It is considered that this configuration inhibits the propagation of a bulk wave in the thickness direction of the piezoelectric substrate 12. Thus, spurious is reduced, and the loss is reduced.

It is found that the thickness T2a of the amorphous layer 12a is more likely to affect the loss as the thickness T2 of the piezoelectric substrate 12 decreases. Hereinafter, a description will be given of experiments.

Experiment 1

Ladder-type filters having different thicknesses T1a of the amorphous layer 10a and different thicknesses T2a of the amorphous layer 12a were fabricated, and the loss was measured. The conditions of the fabricated ladder-type filters are as follows.

Support substrate 10: Polycrystalline spinel substrate with T1=400 μm

Piezoelectric substrate 12: 42° rotated Y-cut X-propagation lithium tantalate substrate with T2=3.5 μm Ladder-type filter: Transmit filter for the long term evolution (LTE) Band26 (receive band: 814 to 849 MHz), six stages (six series resonators and five parallel resonators)

Duty ratio of the electrode finger 15: 50%

In FIG. 3A and FIG. 3B, the upper surface of the support substrate 10 and the lower surface of the piezoelectric substrate 12 are irradiated with an Ar ion beam. The thicknesses T1a and T2a of the amorphous layers 10a and 12a were varied by varying the current value of the Ar ion. The irradiation time of the Ar ion was fixed at 45 seconds.

Figure 5:
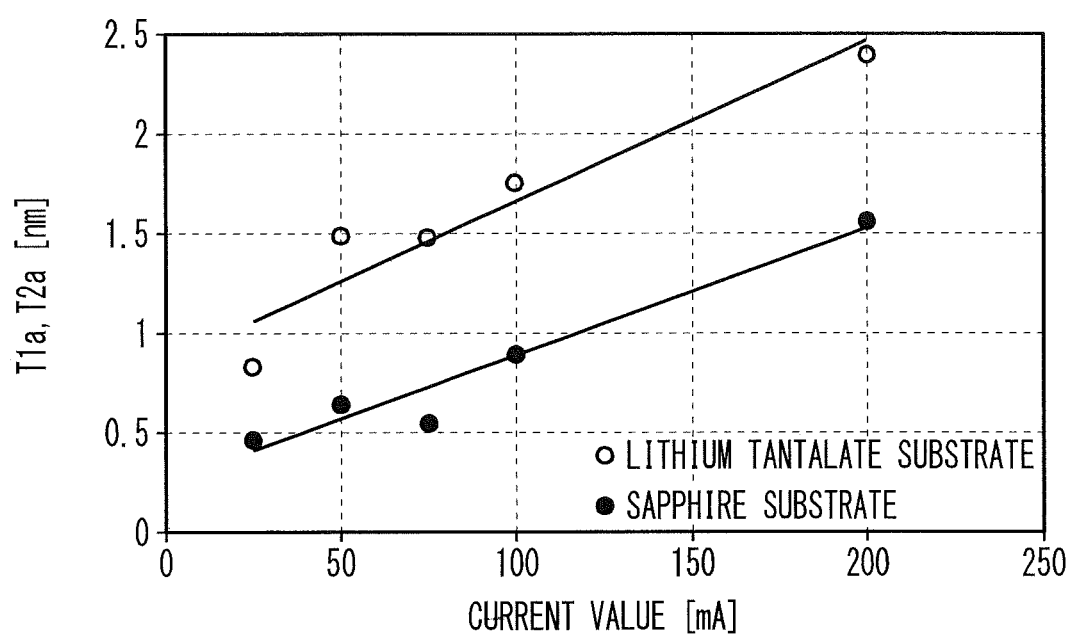
FIG. 5 illustrates a relationship between a current value of an Ar ion and thicknesses T1$a$ and T2$a$.

FIG. 5 illustrates a relationship between the thicknesses T1a and T2a and the current value of the Ar ion. Dots represent measurement points, and a straight line represents the approximated line. As illustrated in FIG. 5, the thicknesses T1a and T2a are substantially proportional to the current value of the Ar ion. The thicknesses T1a and T2a were measured by transmission electron microscopy (TEM). According to the TEM observation, the support substrate 10 and the piezoelectric substrate 12 have regular atomic arrangements, and the amorphous layers 10a and 12a have random atomic arrangements. The amorphous layers 10a and 12a are expressed by different contrasts. Thus, the TEM observation enables to determine the thicknesses T1a and T2a. In the following experiment, the thicknesses T1a and T2a were determined from the current value of the Ar ion with use of FIG. 5.

Figure 6:
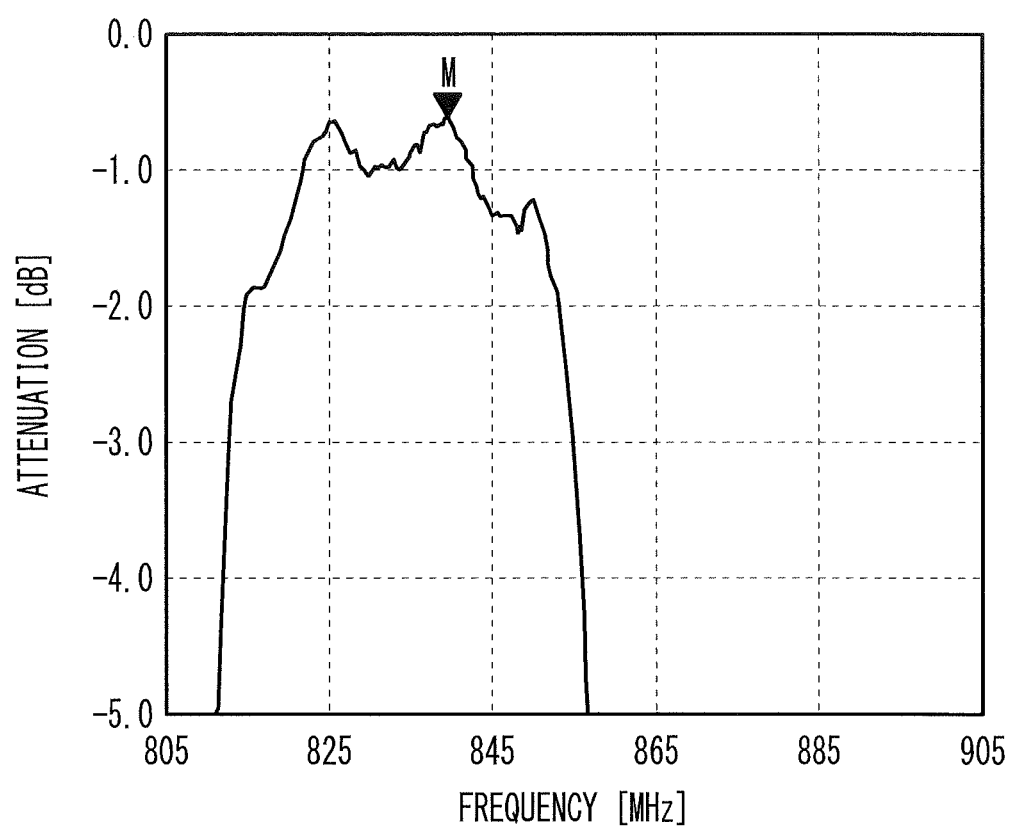
FIG. 6 illustrates the transmission characteristic of a filter used in an experiment 1.

FIG. 6 illustrates the transmission characteristic of a filter used in the experiment 1. As illustrated in FIG. 6, the receive band (814 to 849 MHz) of the LTE Band26 is the passband. The smallest loss (indicated by a marker M in FIG. 6) in the receive band of Band26 was compared among the samples.

Figure 7:
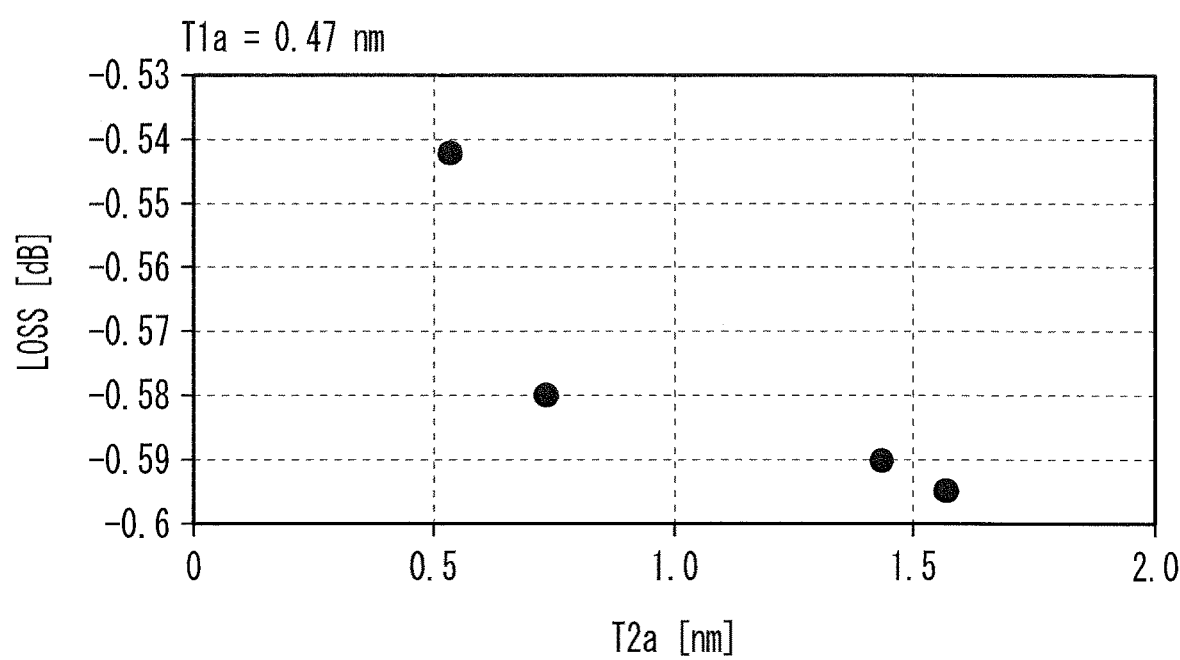
FIG. 7 is a graph of loss versus the thickness T2$a$ in the experiment 1.

FIG. 7 is a graph of loss versus the thickness T2a in the experiment 1. The thickness T1a of the amorphous layer 10a was fixed at 0.47 nm. The loss is the smallest loss in the receive band of Band26. As illustrated in FIG. 7, the sample with a smaller thickness T2a has smaller loss. The loss of the sample having the thickness T2a of approximately 0.5 nm is less than the loss of the sample having the thickness T2a of approximately 1.5 nm by 0.05 dB.

Figure 8A:
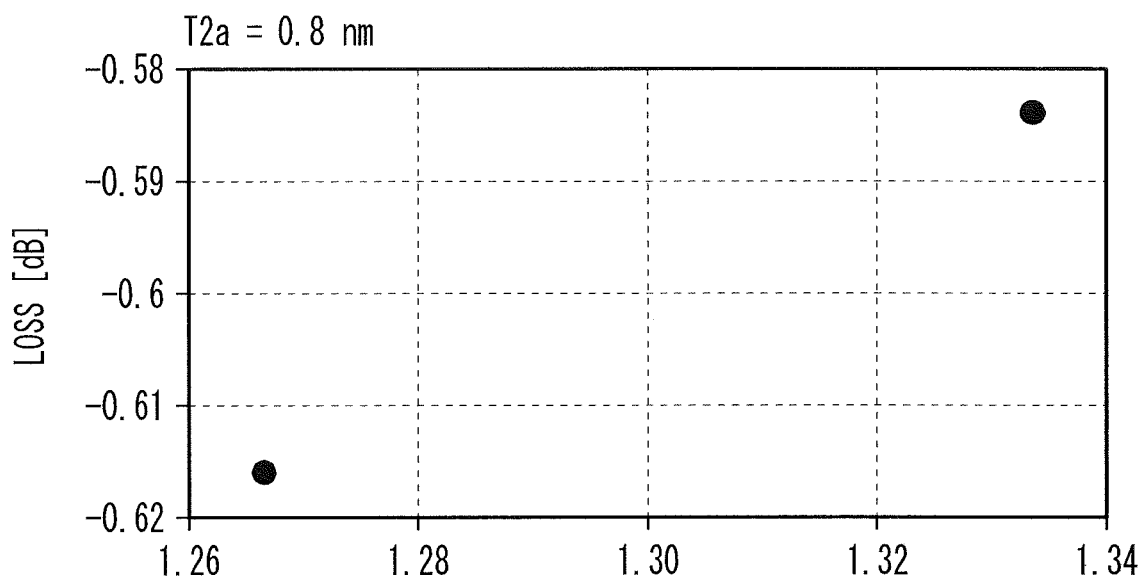
FIG. 8A and FIG. 8B are graphs of loss versus the thickness T1$a$ in the experiment 1.
Figure 8B:
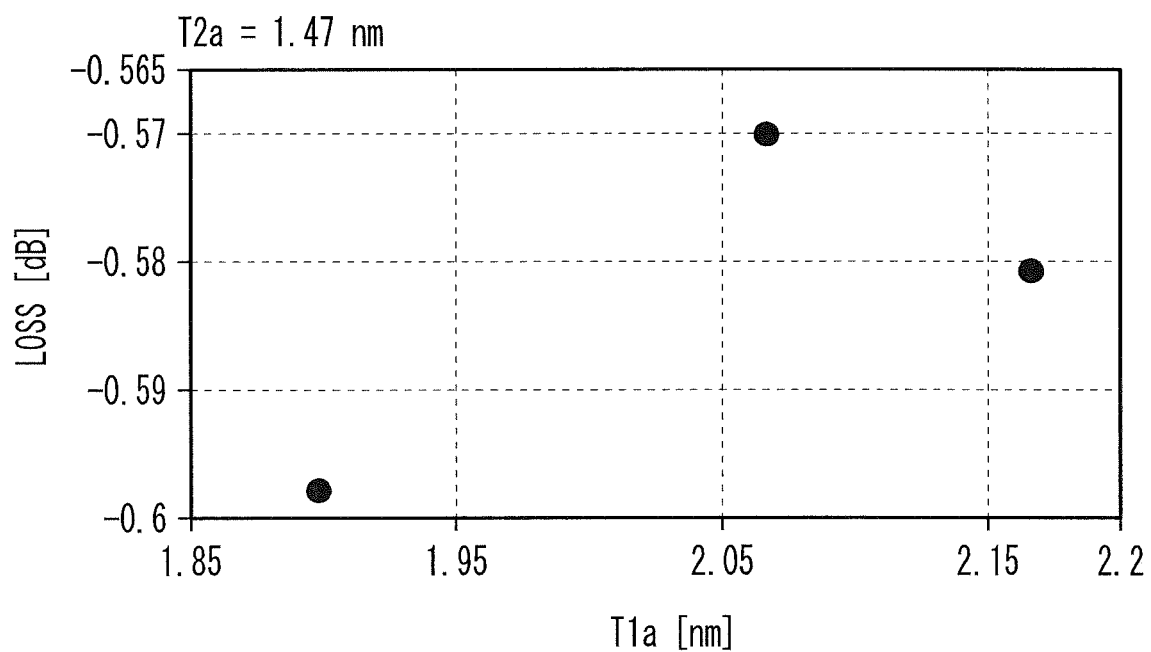

FIG. 8A and FIG. 8B are graphs of loss versus the thickness T1a in the experiment 1. The thickness T2a of the amorphous layer 12a was fixed at 0.8 nm in FIG. 8A, and fixed at 1.47 nm in FIG. 8B. As illustrated in FIG. 8A and FIG. 8B, it seems that the sample with a larger T1a has smaller loss. However, since the number of samples is small and the difference in loss among the samples is small, there is a possibility that the thickness T1a does not affect the loss. FIG. 7, FIG. 8A, and FIG. 8B illustrate the results of different experiment batches. Thus, the loss cannot be simply compared among FIG. 7 through FIG. 8B because other factors affect the loss.

According to the experiment 1, as the thickness T2a of the amorphous layer 12a decreases, the loss decreases. The thickness T1a of the amorphous layer 10a does not affect the loss, or as the thickness T1a increases, the loss decreases.

Experiment 2

A ladder-type filter was fabricated by using a monocrystalline sapphire substrate as the support substrate 10 as in the experiment 1. The thicknesses T1a and T2a of the amorphous layers 10a and 12a were measured by TEM. Table 1 presents T1a, T2a, and the loss.

TABLE 1

| | | | |
|---|---|---|---|
| T2a | 1.5 nm | 1.7 nm | 2.2 nm |
| T1a | 1.0 nm | 1.2 nm | 1.8 nm |
| Loss | 0.40 dB | 0.50 dB | 0.55 dB |

As presented in Table 1, the sample with a smaller thickness T2a of the amorphous layer 12a has smaller loss.

In the experiment 2, the sample with a small T2a also has a small T1a. When it is assumed, from the results of the experiment 1, that the thickness T1a hardly affects the loss or as the thickness T1a increases, the loss decreases, it is considered, from Table 1, that as the thickness T2a decreases, the loss decreases even when the support substrate 10 is a sapphire substrate.

The reason why the thickness T2a of the amorphous layer 12a affects the loss is not clear, but may be considered as follows, for example. When the piezoelectric substrate 12 is thin, the surface acoustic wave reaches the amorphous layer 11. When the thickness T2a of the amorphous layer 12a is large, the piezoelectricity of the piezoelectric substrate 12 near the boundary face between the piezoelectric substrate 12 and the support substrate 10 is reduced. This is considered the reason why the loss is reduced because the surface acoustic wave is affected by the amorphous layer 12a.

As the thickness of the amorphous layer 11 decreases, the bond between the support substrate 10 and the piezoelectric substrate 12 is weakened. Thus, the thickness T1a of the amorphous layer 10a is preferably large.

When it is considered that the surface acoustic wave is affected by the amorphous layer 12a, and the loss is thereby reduced, the thickness T2a is preferably small regardless of the materials of the piezoelectric substrate 12 and the support substrate 10.

Based on the above findings, in the first embodiment, a pair of the comb-shaped electrodes 18 are located on the opposite surface of the piezoelectric substrate 12 from the support substrate 10, and each of the comb-shaped electrodes 18 includes the electrode fingers 15. The amorphous layer 10a (a first amorphous layer) is in contact with the support substrate 10. The amorphous layer 12a (a second amorphous layer) is in contact with the piezoelectric substrate 12 and the amorphous layer 10a.

The amorphous layer 10a is mainly composed of one or more constituent elements of the support substrate 10. The amorphous layer 12a is mainly composed of one or more constituent elements of the piezoelectric substrate 12. The main component is the component excluding the element used for activation in FIG. 3A and FIG. 3B (for example, Ar) and unintended impurities. For example, the amorphous layer 10a contains 50 atomic % or more of the constituent elements of the support substrate 10 (for example, Al, Mg, and O in the case of a spinel substrate) in total, and the amorphous layer 12a contains 50 atomic % or more of the constituent elements of the piezoelectric substrate 12 (for example, Ta, Li, and O in the case of a lithium tantalate substrate) in total.

In the acoustic wave resonator 20 configured as described above, the amorphous layer 12a is configured to be thinner than the amorphous layer 10a. This configuration improves the characteristics including the loss. The thickness T2a of the amorphous layer 12a is preferably equal to or less than 0.9 times, more preferably equal to or less than 0.8 times, further preferably equal to or less than 0.7 times the thickness T1a of the amorphous layer 10a. When the amorphous layer 12a is too thin, the lower surface of the piezoelectric substrate 12 is not activated. Thus, the thickness T2a of the amorphous layer 12a is preferably equal to or greater than 0.1 times the thickness T1a of the amorphous layer 10a.

When the thickness T2a of the amorphous layer 12a is large, the loss increases. Thus, the thickness T2a is preferably 3 nm or less, more preferably 2 nm or less, further preferably 1 nm or less. To activate the lower surface of the piezoelectric substrate 12, the thickness T2a is preferably 0.1 nm or greater, more preferably 0.2 nm or greater.

In view of the bond strength between the support substrate 10 and the piezoelectric substrate 12, the thickness T1a of the amorphous layer 10a is preferably 0.5 nm or greater, more preferably 1 nm or greater, further preferably 2 nm or greater. The thickness T1a is preferably 10 nm or less, more preferably 5 nm or less.

It is sufficient if the thickness T1 of the piezoelectric substrate 12 is thin so that the surface acoustic wave is affected by the amorphous layer 12a. For example, the thickness T1 may be 2λ or less. For example, the thickness T1 of the piezoelectric substrate 12 is configured to be less than the average pitch of the electrode fingers 15 of one of the comb-shaped electrodes 18 (i.e., the wavelength A). This configuration reduces the loss due to a bulk wave. When the piezoelectric substrate 12 is thin, the surface acoustic wave excited by the comb-shaped electrodes 18 is likely to be affected by the amorphous layer 12a. Thus, the amorphous layer 12a is preferably thinned.

The thickness T2 of the piezoelectric substrate 12 is preferably equal to or less than 0.9 times, more preferably equal to or less than 0.8 times, further preferably equal to or less than 0.7 times the average pitch of the electrode fingers 15. This configuration reduces spurious and reduces the loss. The thickness T2 is preferably equal to or greater than 0.1 times, more preferably equal to or greater than 0.2 times the average pitch of the electrode fingers 15. The average pitch of the electrode fingers 15 is calculated by dividing the length of the acoustic wave resonator 20 in the X direction by the number of pairs of the electrode fingers 15 (one-half of the number of the electrode fingers 15). For example, when the wavelength A is 5 μm, the thickness T2 of the piezoelectric substrate 12 is for example, 0.5 μm to 5 μm.

The piezoelectric substrate 12 is preferably a monocrystalline (single-crystal) substrate. This configuration efficiently excites the surface acoustic wave. A lithium tantalate substrate or a lithium niobate substrate may be used as a monocrystalline piezoelectric substrate 12. The support substrate 10 is a monocrystalline substrate, a polycrystalline substrate, or a sintered body substrate, and is, for example, a sapphire substrate, a spinel substrate, a silicon substrate, a crystal substrate, a quartz substrate, or an alumina substrate.

The total atomic concentration of the element other than oxygen among the one or more constituent elements of the support substrate 10 in the amorphous layer 10a is higher than the total atomic concentration of the element other than oxygen among the one or more constituent elements of the piezoelectric substrate 12. The total atomic concentration of the element other than oxygen among the one or more constituent elements of the piezoelectric substrate 12 in the amorphous layer 12a is higher than the atomic concentration of the element other than oxygen among the one or more constituent elements of the support substrate 10. Accordingly, the characteristics including the loss are improved.

When the IDT 22 excites a shear horizontal (SH) wave, the IDT 22 is likely to excite a bulk wave. Thus, the IDT 22 preferably excites an SH wave. Accordingly, the piezoelectric substrate 12 is preferably a 20° to 48° rotated Y-cut X-propagation lithium tantalate substrate.

First Variation of the First Embodiment

Figure 9:
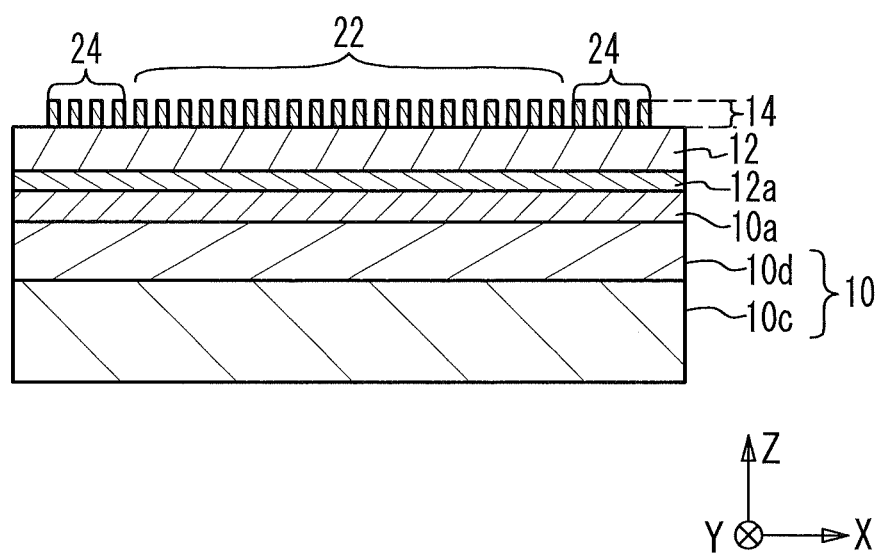
FIG. 9 is a cross-sectional view of an acoustic wave resonator in accordance with a first variation of the first embodiment.

FIG. 9 is a cross-sectional view of an acoustic wave resonator in accordance with a first variation of the first embodiment. As illustrated in FIG. 9, the support substrate 10 may include support substrates 10c and 10d that are stacked. The support substrates 10c and 10d are, for example, the same substrate as the support substrate 10 of the first embodiment. The thickness of the support substrate 10c is, for example, 50 μm to 500 μm, and the thickness of the support substrate 10d is, for example, 0.5 µm to 100 µm. Other structures are the same as those of the first embodiment, and the description thereof is thus omitted.

Second Embodiment

Figure 10:
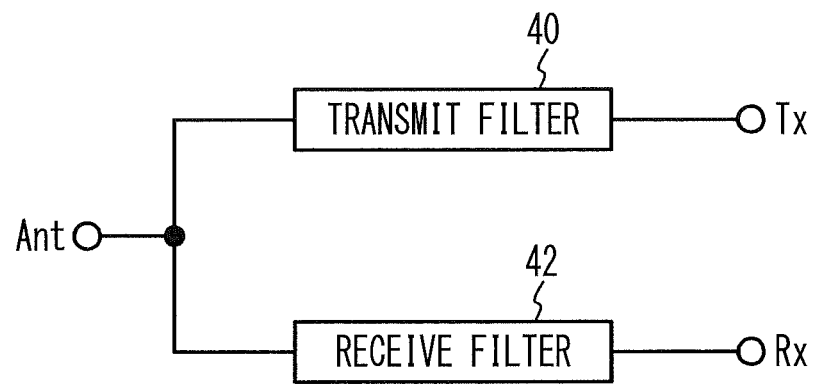
FIG. 10 is a circuit diagram of a duplexer in accordance with a second embodiment.

FIG. 10 is a circuit diagram of a duplexer in accordance with a second embodiment. As illustrated in FIG. 10, a transmit filter 40 is connected between a common terminal Ant and a transmit terminal Tx. A receive filter 42 is connected between the common terminal Ant and a receive terminal Rx. The transmit filter 40 transmits, as transmission signals, signals in the transmit band to the common terminal Ant among high-frequency signals input from the transmit terminal Tx, and suppresses signals with other frequencies. The receive filter 42 transmits, as reception signals, signals in the receive band to the receive terminal Rx among high-frequency signals input from the common terminal Ant, and suppresses signals with other frequencies. At least one of the transmit filter 40 and the receive filter 42 may be the filter illustrated in FIG. 4. The filter can be a ladder-type filter or a multimode type filter.

A duplexer is described as an example of the multiplexer, but the multiplexer may be a triplexer or a quadplexer.

Third Embodiment

Figure 11:
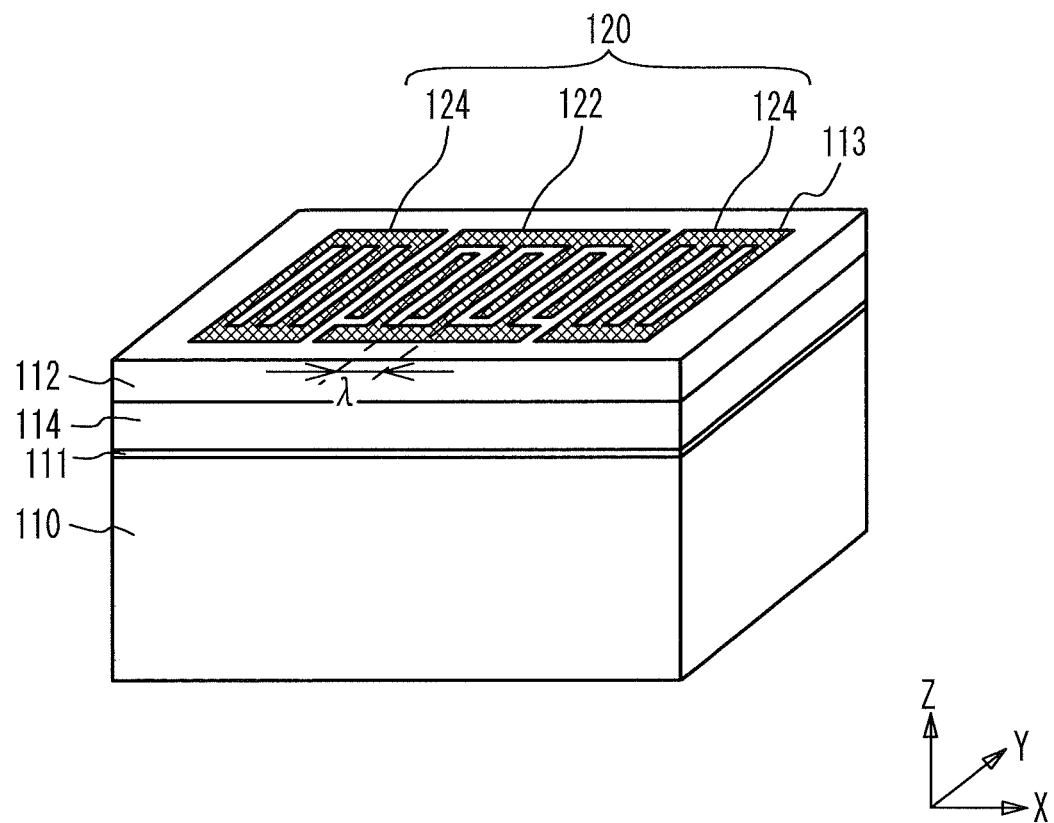
FIG. 11 is a perspective view of an acoustic wave resonator in accordance with a third embodiment.
Figure 12A:
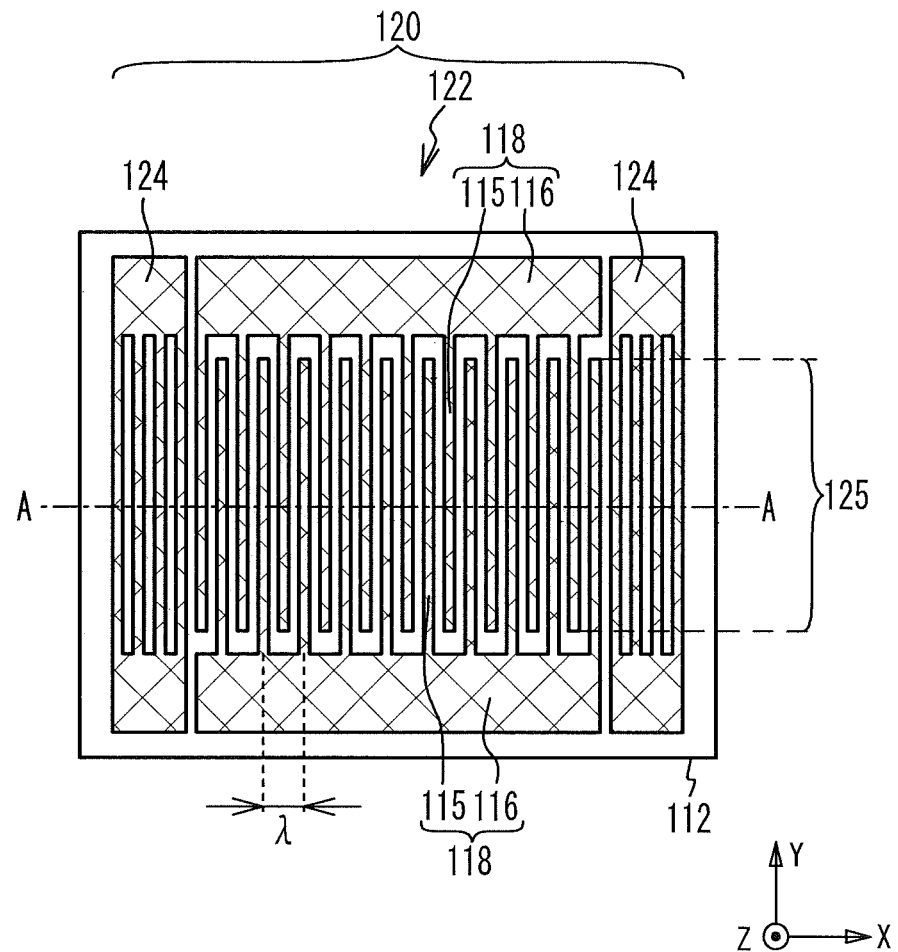
FIG. 12A is a plan view of the acoustic wave resonator in the third embodiment.
Figure 12B:
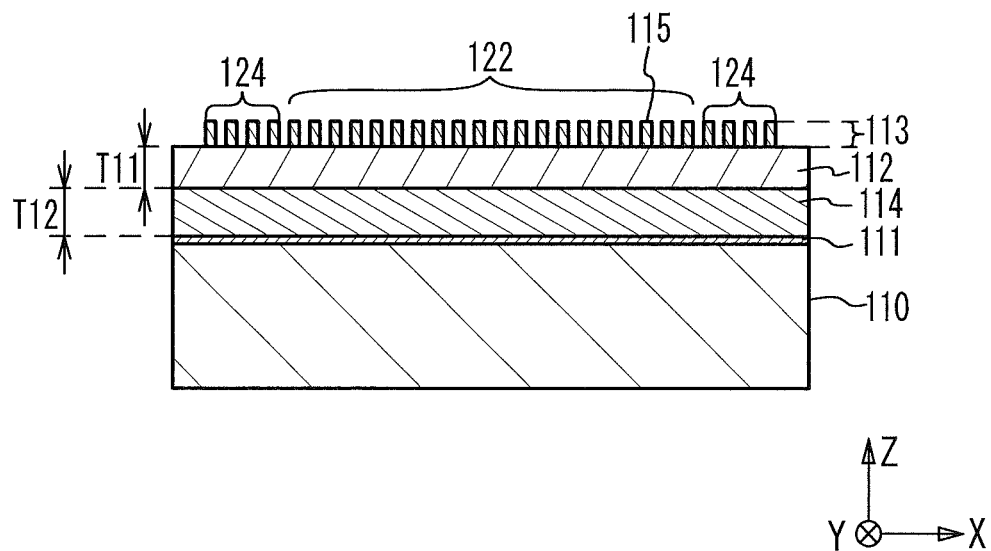
FIG. 12B is a cross-sectional view taken along line A-A in FIG. 12A.

FIG. 11 is a perspective view of an acoustic wave resonator in accordance with a third embodiment, FIG. 12A is a plan view of the acoustic wave resonator in the third embodiment, and FIG. 12B is a cross-sectional view taken along line A-A in FIG. 12A. The direction in which electrode fingers are arranged is defined as an X direction, the direction in which the electrode finger extends is defined as a Y direction, and the direction in which a support substrate and a piezoelectric substrate are stacked is defined as a Z direction. The X direction, the Y direction, and the Z direction do not necessarily correspond to the X-axis orientation and the Y-axis orientation of the crystal orientation of the piezoelectric substrate.

As illustrated in FIG. 11, FIG. 12A, and FIG. 12B, a temperature compensation film 114 is bonded on a support substrate 110 through a bonding film 111. A piezoelectric substrate 112 is bonded on the temperature compensation film 114. The thickness of the piezoelectric substrate 112 is represented by T11, and the thickness of the temperature compensation film 114 is represented by T12.

An acoustic wave resonator 120 is located on the piezoelectric substrate 112. The acoustic wave resonator 120 includes an IDT 122 and reflectors 124. The reflectors 124 are located at both sides of the IDT 122 in the X direction. The IDT 122 and the reflectors 124 are formed of a metal film 113 on the piezoelectric substrate 112.

The IDT 122 includes a pair of comb-shaped electrodes 118 facing each other. The comb-shaped electrode 118 includes a plurality of electrode fingers 115 and a bus bar 116 to which the electrode fingers 115 are coupled. The region where the electrode fingers 115 of a pair of the comb-shaped electrodes 118 overlap is an overlap region 125. The length of the overlap region 125 corresponds to an aperture length. A pair of the comb-shaped electrodes 118 is arranged so as to face each other so that the electrode fingers 115 of one of the comb-shaped electrodes 118 and the electrode fingers 115 of the other are substantially alternately arranged in at least a part of the overlap region 125. In the overlap region 125, the acoustic wave excited by the electrode fingers 115 mainly propagates in the X direction.

The pitch of two electrode fingers 115 of the comb-shaped electrode 118 corresponds to the wavelength λ of the acoustic wave. The reflectors 124 reflect the acoustic wave (a surface acoustic wave) excited by the electrode fingers 115 of the IDT 122. Accordingly, the acoustic wave is confined in the overlap region 125 of the IDT 122.

The piezoelectric substrate 112 is, for example, a monocrystalline lithium tantalate ($TaLiO_3$) substrate or a monocrystalline lithium niobate ($NbLiO_3$) substrate, and is, for example, a rotated Y-cut X-propagation lithium tantalate substrate or a rotated Y-cut X-propagation lithium niobate substrate.

The temperature compensation film 114 has a temperature coefficient of phase velocity (i.e., the temperature coefficient of elastic modulus) opposite in sign to the temperature coefficient of phase velocity of the piezoelectric substrate 112. For example, the temperature coefficient of phase velocity of the piezoelectric substrate 112 is negative, and the temperature coefficient of phase velocity of the temperature compensation film 114 is positive. The temperature compensation film 114 is, for example, an additive-free silicon oxide ($SiO_2$) film or a $SiO_2$ film containing additive elements, and is amorphous.

The support substrate 110 is, for example, a sapphire substrate, a spinel substrate, a silicon substrate, a crystal substrate, a quartz substrate, or an alumina substrate. The sapphire substrate is a monocrystalline $Al_2O_3$ substrate, the spinel substrate is a monocrystalline or polycrystalline $MgAl_2O_4$ substrate, the silicon substrate is a monocrystalline Si substrate, the crystal substrate is a single crystal $SiO_2$ substrate, the quartz substrate is a polycrystalline $SiO_2$ substrate, and the alumina substrate is a polycrystalline $Al_2O_3$ substrate. The linear thermal expansion coefficient of the support substrate 110 in the X direction is less than the linear thermal expansion coefficient of the piezoelectric substrate 112 in the X direction.

The bonding film 111 is a layer for bonding the support substrate 110 and the temperature compensation film 114. For example, as described in Patent Document 1, the upper surface of the support substrate 110 and the lower surface of the temperature compensation film 114 are activated by an ion beam, a neutral beam, or plasma. At this time, an amorphous layer is formed on each of the upper surface of the support substrate 110 and the lower surface of the temperature compensation film 114. The lower surface of the temperature compensation film 114 is bonded to the upper surface of the support substrate 110 by bonding the amorphous layers. In this case, the thickness of the bonding film 111 is 1 nm to 8 nm. The bonding film 111 may be an insulating film having a thickness of 1 nm to 100 nm. The bonding film 111 may not be necessarily provided. The bonding film 111 may be located between the temperature compensation film 114 and the piezoelectric substrate 112.

The metal film 113 is a film mainly composed of, for example, aluminum (Al) or copper (Cu), and is, for example, an Al film or a Cu film. An adhesion film such as a titanium (Ti) film or a chrome (Cr) film may be located between the electrode fingers 115 and the piezoelectric substrate 112. The adhesion film is thinner than the electrode fingers 115. An insulating film may be located so as to cover the electrode fingers 115. The insulating film functions as a protective film or a temperature compensation film.

Description of the Reason why the Temperature Compensation Film is Provided

The following describes the reason why the temperature coefficient of frequency is close to 0 in the third embodiment. The temperature coefficient of frequency TCF is expressed by the following equation.

$$TCF = TCV - CTE$$

The temperature coefficient of velocity (TCV) represents the temperature coefficient of acoustic velocity (phase velocity). The coefficient of thermal expansion (CTE) represents a thermal expansion coefficient. The linear thermal expansion coefficient in the X-axis orientation of an X-propagation lithium tantalate substrate used as the piezoelectric substrate 112 is approximately 16 ppm/K. The linear thermal expansion coefficient of the c-axis (the axis parallel to the X-axis) of a sapphire substrate used as the support substrate 110 is approximately 7.7 ppm/K. Thus, as the thickness of the piezoelectric substrate 112 is reduced, the CTE of the acoustic wave resonator 120 becomes closer to the CTE of the support substrate 110. However, the CTE of the acoustic wave resonator 120 does not become smaller than the CTE of the support substrate 110.

The linear thermal expansion coefficient is typically positive regardless of materials. In addition, a typical material used as the piezoelectric substrate 112 has a negative TCV. Accordingly, the TCF is negative. Thus, a material with a positive TCV is used as the temperature compensation film 114. Accordingly, the positive TCV of the temperature compensation film 114 compensates the negative TCV of the piezoelectric substrate 112 and –CTE of the support substrate 110. Therefore, the TCF can be configured to be near 0.

Description of the Ranges in Thicknesses of the Piezoelectric Substrate 112 and the Temperature Compensation Film 114

Figure 13:
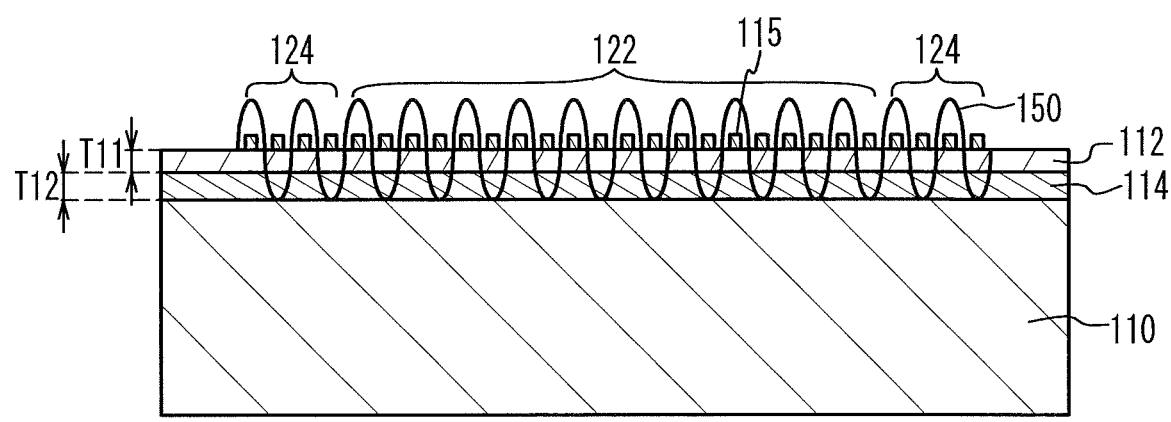
FIG. 13 is a cross-sectional view of the acoustic wave resonator in accordance with the third embodiment.

Next, preferable thicknesses of the piezoelectric substrate 112 and the temperature compensation film 114 will be described. FIG. 13 is a cross-sectional view of the acoustic wave resonator in accordance with the third embodiment. As illustrated in FIG. 13, the electrode fingers 115 of the IDT 122 excite an acoustic wave 150. The acoustic wave 150 in the drawing illustrates an image of displacement, and is different from the actual displacement of the acoustic wave. For example, when the piezoelectric substrate 112 is a rotated Y-cut X-propagation lithium tantalate substrate, the IDT 122 mainly excites a shear horizontal (SH) wave. The SH wave is a wave that oscillates in the direction parallel to the surface of the piezoelectric substrate 112 and perpendicular to the propagation direction of the SH wave. When the TCV of the temperature compensation film 114 compensates the negative TCV of the piezoelectric substrate 112 and –CTE of the support substrate 110, the displacement of the surface acoustic wave is required to be distributed in the temperature compensation film 114.

Figure 14A:
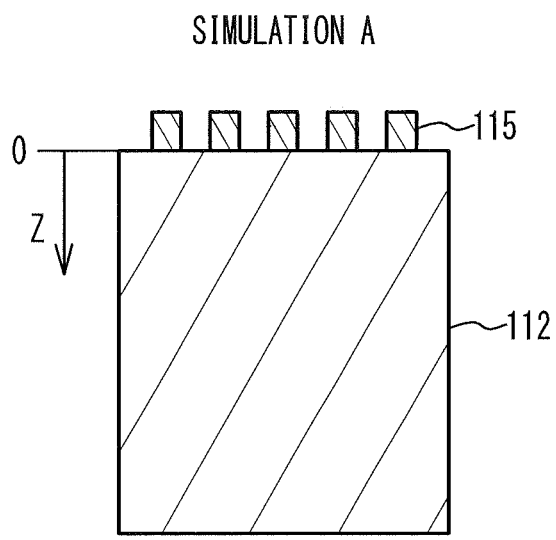
FIG. 14A and FIG. 14B are cross-sectional views of acoustic wave resonators in simulations A and B, respectively.
Figure 14B:
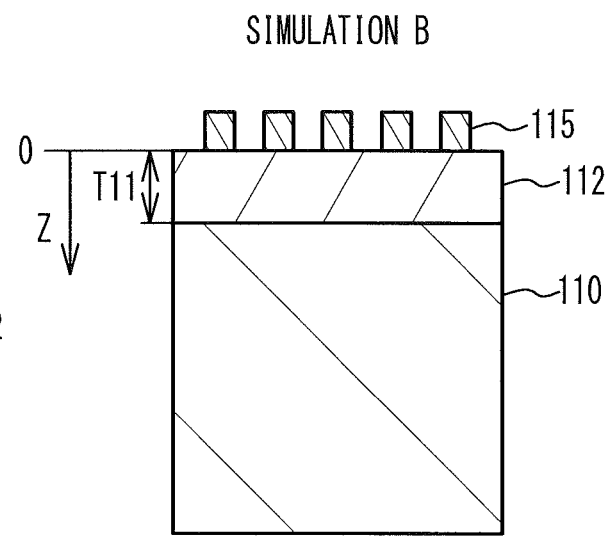

Thus, the distribution in total displacement at the resonant frequency in the substrate was simulated. FIG. 14A and FIG. 14B are cross-sectional views of acoustic wave resonators in simulations A and B, respectively. As illustrated in FIG. 14A, in the simulation A, it is assumed that only a 42° rotated Y-cut X-propagation lithium tantalate substrate that is the piezoelectric substrate 112 is provided as the substrate, and the support substrate 110 and the temperature compensation film 114 are not provided. As illustrated in FIG. 14B, in the simulation B, it is assumed that a sapphire substrate that is the support substrate 110 and a 42° rotated Y-cut X-propagation lithium tantalate substrate that is the piezoelectric substrate 112 are provided as the substrate, and the temperature compensation film 114 is not provided. The thickness T11 of the piezoelectric substrate 112 was assumed to be approximately 0.7λ. In both the simulations A and B, the surface of the piezoelectric substrate 112 with which the electrode finger 115 is in contact was defined as 0, and the depth direction of the substrate was defined as a position Z.

Figure 15A:
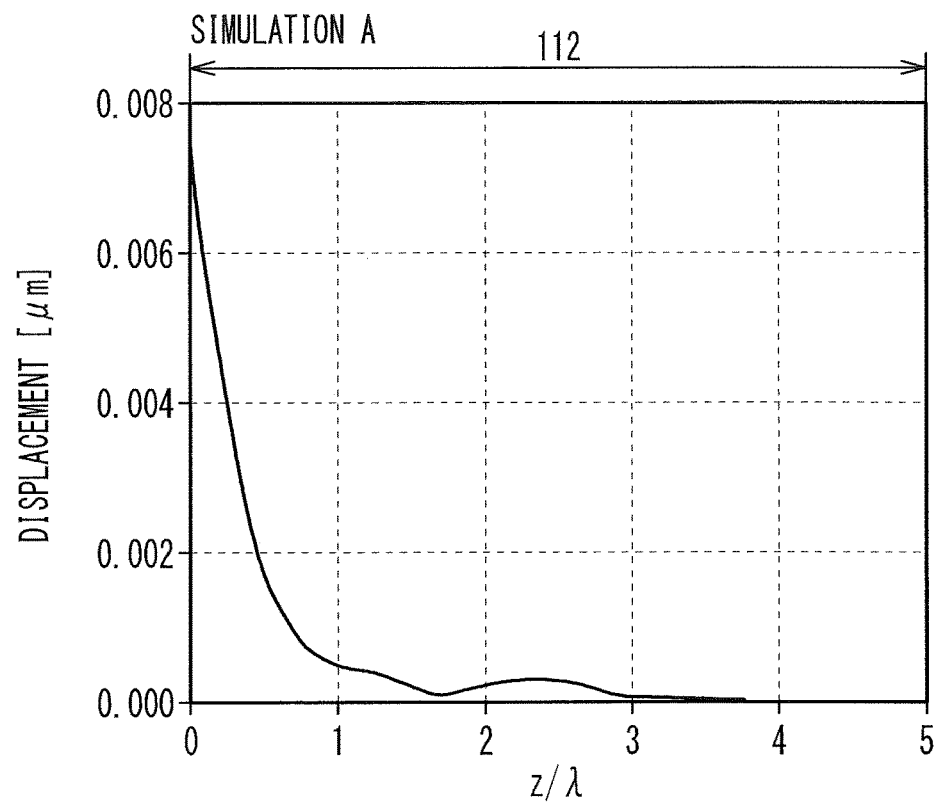
FIG. 15A and FIG. 15B illustrate distributions in total displacement with respect to a position Z in the simulations A and B, respectively.
Figure 15B:
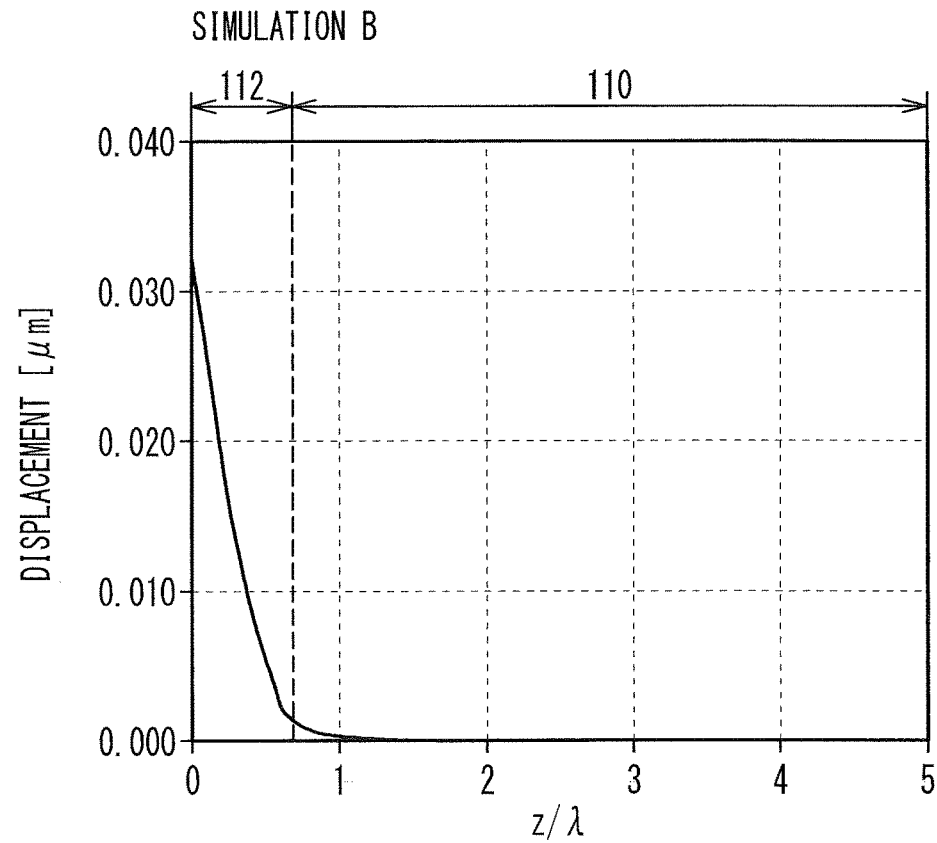

FIG. 15A and FIG. 15B illustrate the distributions in total displacement with respect to the position Z in the simulations A and B, respectively. Double-headed arrows indicating the regions of the piezoelectric substrate 112 and the support substrate 110 are illustrated in the upper part of FIG. 15A and FIG. 15B. As illustrated in FIG. 15A, in the simulation A, the displacement is mostly distributed within the range of Z/λ equal to or less than 2. In particular, the displacement is mostly distributed within the range of Z/λ equal to or less than 1.5. This indicates that the surface acoustic wave propagates through the region from the surface of the piezoelectric substrate 112 to approximately 2λ (in particular, 1.5λ). As illustrated in FIG. 15B, in the simulation B, the displacement is mostly distributed within the range of Z/λ equal to or less than 1. In particular, the displacement is hardly distributed in the support substrate 110. This is because the phase velocity of the support substrate 110 is large.

As seen from the above simulations, the surface acoustic wave propagates through the region from the substrate surface to 2λ (in particular, 1.5λ). Thus, in the third embodiment, to allow the temperature compensation film 114 to function, the temperature compensation film 114 is required to be present within the depth equal to or less than 2λ (in particular, 1.5λ) from the substrate surface.

Figure 16A:
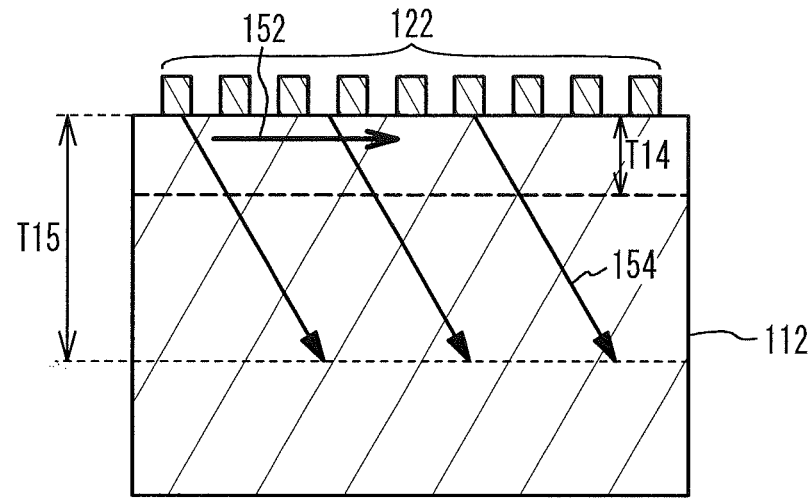
FIG. 16A through FIG. 16C are cross-sectional views for describing a bulk wave.
Figure 16B:
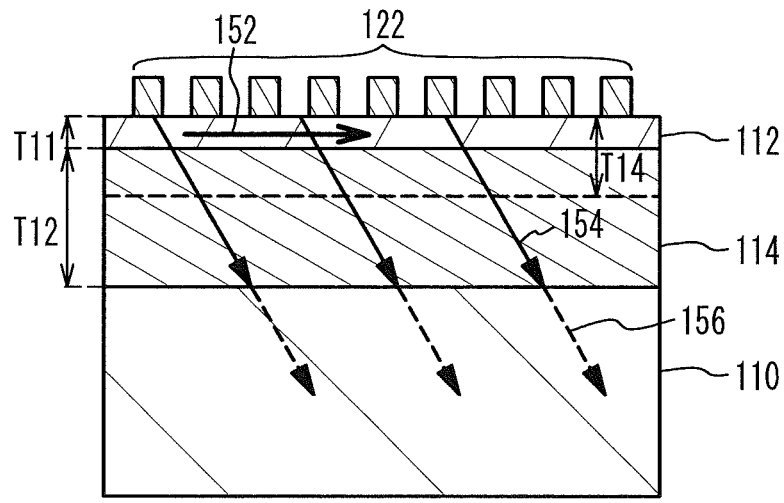
Figure 16C:
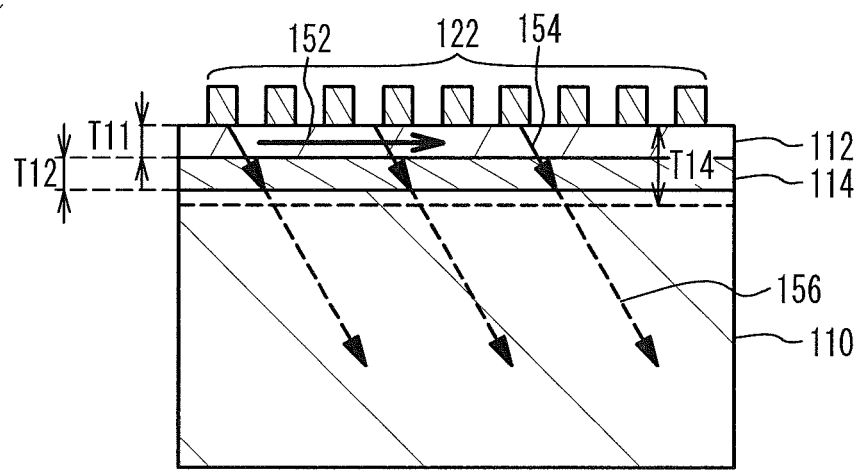

Next, a bulk wave will be described. FIG. 16A through FIG. 16C are cross-sectional views for describing a bulk wave. As illustrated in FIG. 16A, when only the piezoelectric substrate 112 is provided as the substrate, the IDT 122 excites a surface acoustic wave 152 such as an SH wave on the surface of the piezoelectric substrate 112. The thickness T14 within which the displacement of the surface acoustic wave 152 is present is approximately 2λ. When the IDT 122 excites the surface acoustic wave 152, the IDT 122 emits a bulk wave 154 in the piezoelectric substrate 112. The bulk wave 154 is one-tenth of the surface acoustic wave 152, which is a primary mode, in magnitude. The thickness T15 within which the bulk wave 154 is present is approximately 10λ. When the bulk wave 154 propagates through the piezoelectric substrate 112, the energy of the surface acoustic wave 152 is lost as the bulk wave 154. Thus, the loss of the acoustic wave resonator increases.

As illustrated in FIG. 16B, the temperature compensation film 114 is provided under the piezoelectric substrate 112, and the support substrate 110 is provided under the temperature compensation film 114. The thickness T11 of the piezoelectric substrate 112 is less than the thickness T14. Thus, the displacement of the surface acoustic wave 152 is distributed in both the piezoelectric substrate 112 and the temperature compensation film 114. Accordingly, the TCF is reduced. When the thickness T12 of the temperature compensation film 114 is large, the bulk wave 154 propagates through the temperature compensation film 114. Thus, the energy of the surface acoustic wave 152 is lost as the bulk wave 154. Accordingly, the loss of the acoustic wave resonator increases. As indicated by arrows 156, the bulk wave does not propagate into the support substrate 110.

As illustrated in FIG. 16C, in the third embodiment, the temperature compensation film 114 is thinned, and the sum of the thicknesses T11 and T12 is configured to be less than the thickness T14. The support substrate 110 has a phase velocity greater than the phase velocities of the piezoelectric substrate 112 and the temperature compensation film 114.

For example, the phase velocities of the fast lateral waves of lithium tantalate, silicon oxide, and sapphire are respectively approximately 4211 m/s, approximately 5840 m/s, and 6761 m/s. Thus, as indicated by the arrows 156, a bulk wave does not propagate into the support substrate 110. Both the surface acoustic wave 152 and the bulk wave 154 are confined in the piezoelectric substrate 112 and the temperature compensation film 114. Thus, the loss of the acoustic wave resonator is reduced. In addition, spurious due to a bulk wave is reduced.

Experiment 3

Acoustic wave resonators of the third embodiment and a first comparative example were fabricated. The fabrication conditions are as follows.

Third Embodiment

Support substrate 110: Monocrystalline sapphire substrate having a thickness of 500 μm and the R-plane as the upper surface Temperature compensation film 114: Silicon oxide ($SiO_2$) film with the thickness T12 of 1 μm Piezoelectric substrate 112: 42° rotated Y-cut X-propagation lithium tantalate substrate with the thickness T11 of 1 μm Wavelength λ of the acoustic wave: 4 μm First Comparative Example Support substrate 110: Monocrystalline sapphire substrate having a thickness of 500 μm and the R-plane as the upper surface Temperature compensation film 114: not provided Piezoelectric substrate 112: 42° rotated Y-cut X-propagation lithium tantalate substrate with a thickness of 3 μm Wavelength λ of the acoustic wave: 4 μm The TCFs at the resonant frequencies of the third embodiment and the first comparative example were measured. In the third embodiment, TCF=6 ppm/K while in the first comparative example, TCF=−13.4 ppm/K.

Figure 17:
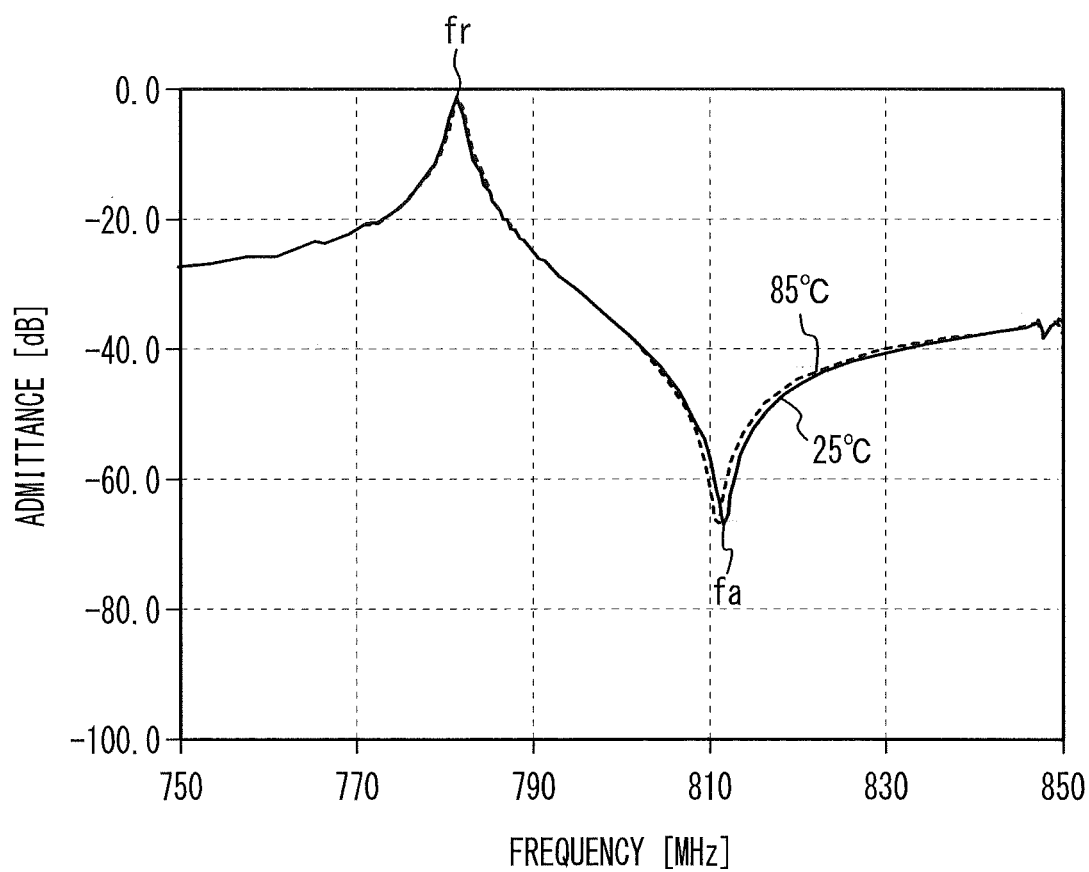
FIG. 17 is a graph of the admittance of the acoustic wave resonator versus frequency in the third embodiment.

FIG. 17 is a graph of the admittance of the acoustic wave resonator versus frequency in the third embodiment. As illustrated in FIG. 17, the admittance characteristics at 25° C. and 85° C. are almost the same. The resonant frequency fr and the antiresonant frequency fa hardly depend on the temperature. As seen above, the provision of the temperature compensation film 114 enables to make the TCF close to 0.

Fabrication Method of the Third Embodiment

Figure 18A:
FIG. 18A through FIG. 18E are cross-sectional views (No. 1) illustrating a method of fabricating the acoustic wave resonator in accordance with the third embodiment.
Figure 18B:
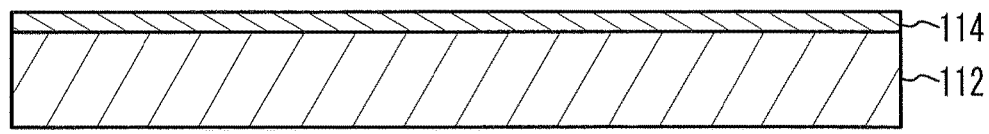
Figure 18C:
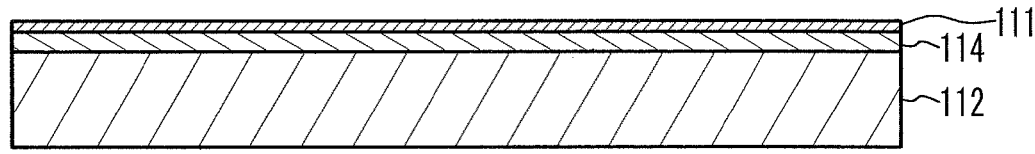
Figure 18D:
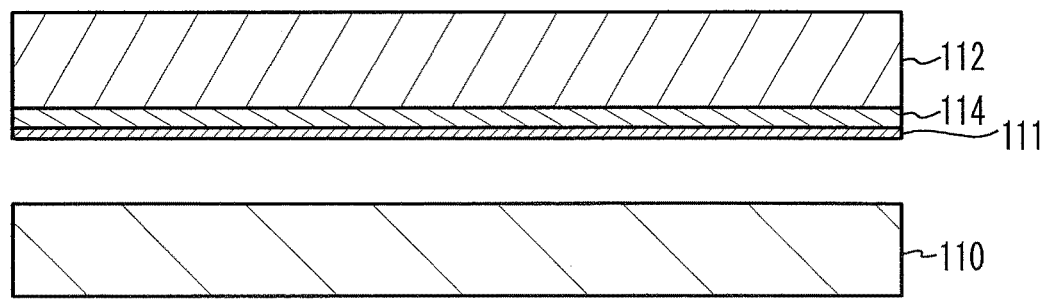
Figure 18E:
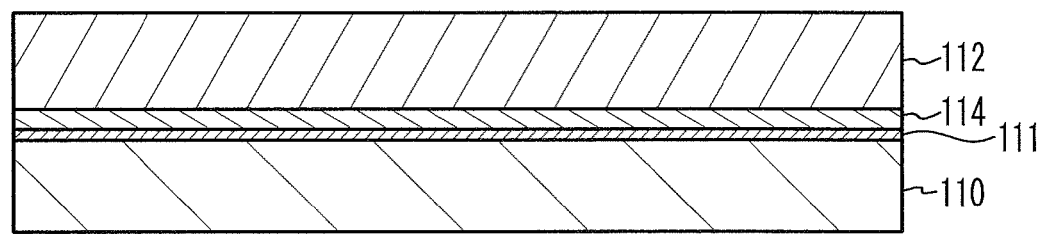

A description will be given of a method of fabricating the acoustic wave resonator in accordance with the third embodiment. FIG. 18A through FIG. 20B are cross-sectional views illustrating the method of fabricating the acoustic wave resonator in accordance with the third embodiment. As illustrated in FIG. 18A, the piezoelectric substrate 112 is prepared. As illustrated in FIG. 18B, the temperature compensation film 114 is formed on the piezoelectric substrate 112 by sputtering, vacuum evaporation, or chemical vapor deposition (CVD). As illustrated in FIG. 18C, the bonding film 111 is formed on the temperature compensation film 114 by sputtering, vacuum evaporation, or CVD. The bonding film 111 is, for example, a silicon film, an aluminum oxide film, or an aluminum nitride film. As illustrated in FIG. 18D, the upper surface of the support substrate 110 and the lower surface of the bonding film 111 are activated. The activation method is, for example, the same as the method described in Patent Document 1. As illustrated in FIG. 18E, the support substrate 110 and the bonding film 111 are bonded at normal temperature.

Figure 19A:
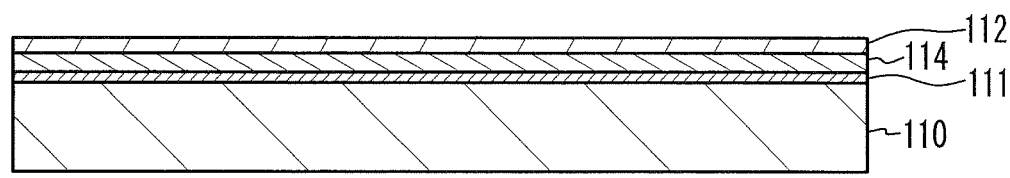
FIG. 19A through FIG. 19D are cross-sectional views (No. 2) illustrating the method of fabricating the acoustic wave resonator in accordance with the third embodiment.
Figure 19B:
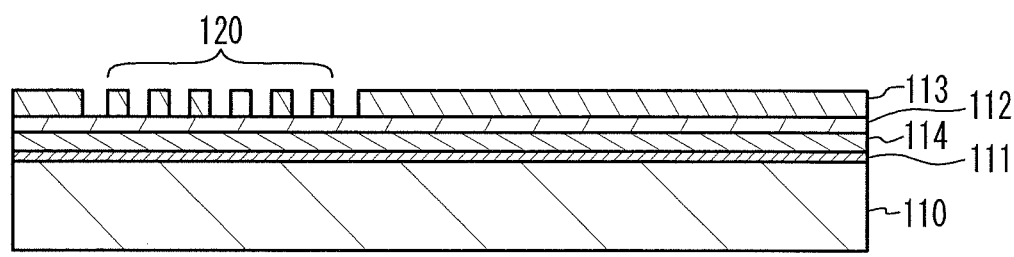
Figure 19C:
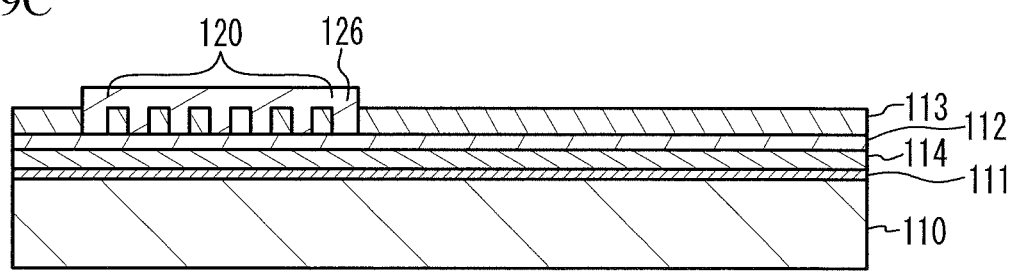
Figure 19D:
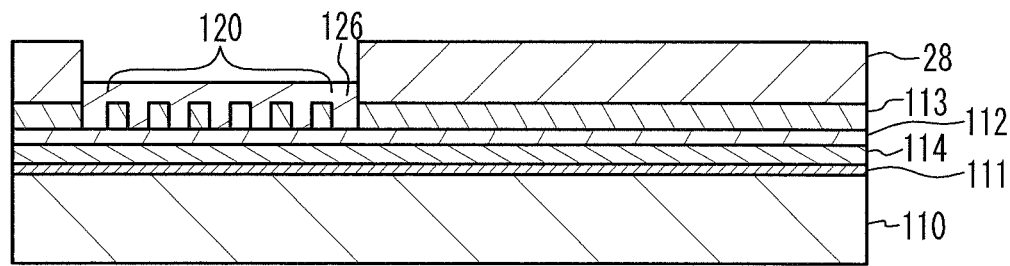

As illustrated in FIG. 19A, the upper surface of the piezoelectric substrate 112 is thinned by, for example, chemical mechanical polishing (CMP). As illustrated in FIG. 19B, the metal film 113 is formed on the upper surface of the piezoelectric substrate 112. The metal film 113 forms the acoustic wave resonator 120. As illustrated in FIG. 19C, a protective film 126 is formed so as to cover the acoustic wave resonator 120. The protective film 126 is, for example, an insulating film such as a silicon nitride film or a silicon oxide film. As illustrated in FIG. 19D, a wiring line layer 128 is formed on the metal film 113. The wiring line layer 128 is, for example, a copper layer or a gold layer. Individual chips are separated from each other.

Figure 20A:
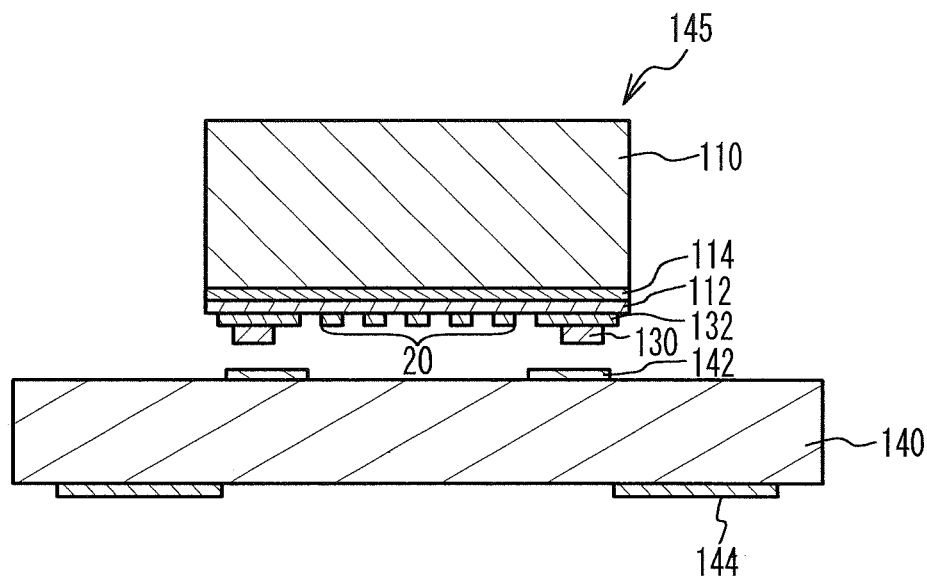
FIG. 20A and FIG. 20B are cross-sectional views (No. 3) illustrating the method of fabricating the acoustic wave resonator in accordance with the third embodiment.
Figure 20B:
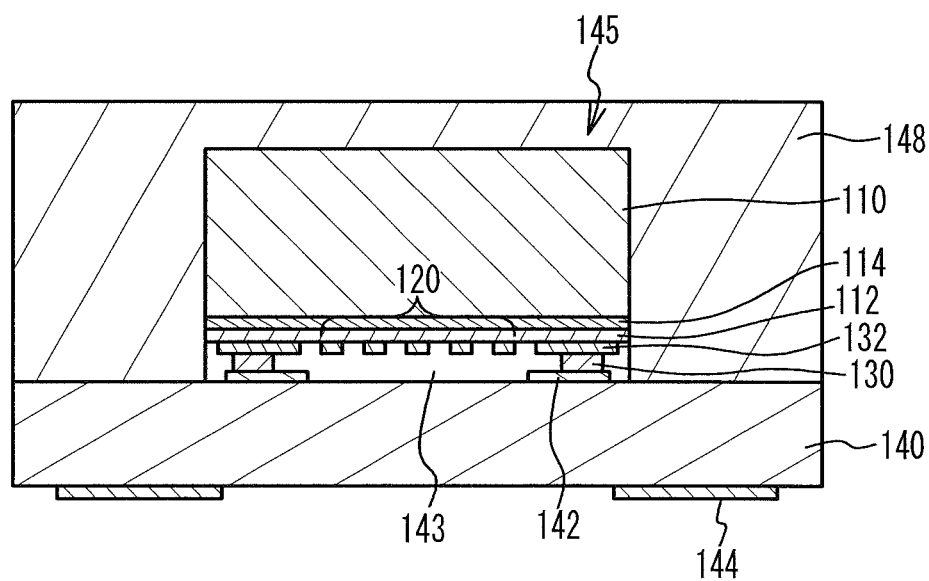

As illustrated in FIG. 20A, in a chip 145, the acoustic wave resonator 120 and pads 132 are located under the piezoelectric substrate 112, and bumps 130 are located under the pads 132. The pad 132 is, for example, a part of the wiring line layer in FIG. 19D. The bump 130 is, for example, a gold bump or a solder bump. The illustration of the protective film 126 is omitted. Pads 142 are located on a package substrate 140, and terminals 144 are located under the package substrate 140. The bump 130 is bonded to the pad 142. As illustrated in FIG. 20B, a sealing portion 148 is formed on the package substrate 140 so as to cover the chip 145. The sealing portion 148 is formed of, for example, an insulating material such as a resin or a metal such as solder. The sealing portion 148 seals the acoustic wave resonator 120 in an air gap 143. The acoustic wave device is fabricated through the above processes.

In the third embodiment, the piezoelectric substrate 112 is located on the support substrate 110, and has a phase velocity less than the phase velocity of the support substrate 110. The temperature compensation film 114 is located between the support substrate 110 and the piezoelectric substrate 112, has a phase velocity less than the phase velocity of the support substrate 110, and has a temperature coefficient of phase velocity (TCV) opposite in sign to the temperature coefficient of phase velocity (TCV) of the piezoelectric substrate 112. A pair of the comb-shaped electrodes 118 is located on the piezoelectric substrate 112, each of the comb-shaped electrodes 118 includes the electrode fingers 115, and the average pitch of the electrode fingers 115 of one of the comb-shaped electrodes is equal to or greater than one-half of the total thickness (T11+T12) of the temperature compensation film 114 and the piezoelectric substrate 112.

The TCV of the temperature compensation film 114 is configured to be opposite in sign to the TCV of the piezoelectric substrate 112. This configuration reduces the TCF as described in FIG. 13. The average pitch of the electrode fingers 115 (substantially corresponding to the wavelength A of the acoustic wave) is configured to be equal to or greater than one-half of the thickness (T11+T12). This configuration causes the acoustic wave to propagate through the piezoelectric substrate 112 and the temperature compensation film 114 as illustrated in FIG. 15A and FIG. 15B, thereby reducing the TCF. Therefore, the frequency temperature characteristic is improved. Furthermore, as described in FIG. 16A through FIG. 16C, the loss due to a bulk wave is reduced.

The average pitch of the electrode fingers 115 can be calculated by dividing the length of the acoustic wave resonator 120 in the X direction by the number of pairs of the electrode fingers 115 (one-half of the number of the electrode fingers 115). The average pitch of the electrode fingers 115 is preferably equal to or greater than 1/1.5 times, more preferably equal to or greater than 1/1.2 times, further preferably equal to or greater than 1 time the total thickness (T11+T12) of the temperature compensation film 114 and the piezoelectric substrate 112. To make the surface acoustic wave propagate through the piezoelectric substrate 112 and the temperature compensation film 114, the average pitch of the electrode fingers 115 is preferably equal to or less than 1/0.1 times, more preferably equal to or less than 1/0.2 times, further preferably equal to or less than 1 time the thickness (T11+T12).

The average pitch of the electrode fingers 115 is greater than the thickness T11 of the piezoelectric substrate 112. This configuration allows the displacement of the surface acoustic wave to be distributed more in the temperature compensation film 114 as illustrated in FIG. 15A and FIG. 15B. The average pitch of the electrode fingers 115 is preferably equal to or greater than 1/0.8 times, more preferably equal to or greater than 1/0.6 times, further preferably 1/0.5 times the thickness T11 of the piezoelectric substrate 112. To make the surface acoustic wave propagate through the piezoelectric substrate 112, the average pitch of the electrode fingers 115 is preferably equal to or less than 1/0.1 times, more preferably equal to or less than 1/0.2 times, further preferably equal to or less than 1/0.3 times the thickness T11 of the piezoelectric substrate 112.

The linear thermal expansion coefficient of the support substrate 110 in the arrangement direction in which the electrode fingers 115 are arranged is less than the linear thermal expansion coefficient of the piezoelectric substrate 112 in the arrangement direction. This configuration reduces the CTE.

To reduce the TCF, the ratio of the thickness T11 of the piezoelectric substrate 112 to the total thickness (T11+T12) is preferably 0.1 or greater and 0.9 or less, more preferably 0.2 or greater and 0.8 or less, further preferably 0.3 or greater and 0.7 or less. As in the experiment of FIG. 17, the thicknesses T11 and T12 are preferably approximately equal to each other so that T11/(T11+T12) is 0.4 or greater and 0.6 or less.

The piezoelectric substrate 112 is a lithium tantalate substrate or a lithium niobate substrate. The support substrate 110 is a sapphire substrate, a spinel substrate, a silicon substrate, a crystal substrate, a quartz substrate, or an alumina substrate, and is a monocrystalline substrate or a polycrystalline substrate. The temperature compensation film 114 is a silicon oxide film. This configuration improves the frequency temperature characteristic and reduces the loss.

As described in FIG. 13, when a pair of the comb-shaped electrodes 118 excites a surface acoustic wave (in particular, an SH wave), a bulk wave is likely to be generated. Thus, when the surface acoustic wave is an SH wave, the total thickness (T11+T12) is preferably configured to be 1.5λ or less. To make the surface acoustic wave an SH wave, the piezoelectric substrate 112 is preferably a 20° to 148° rotated Y-cut X-propagation lithium tantalate substrate.

Fourth Embodiment

Figure 21A:
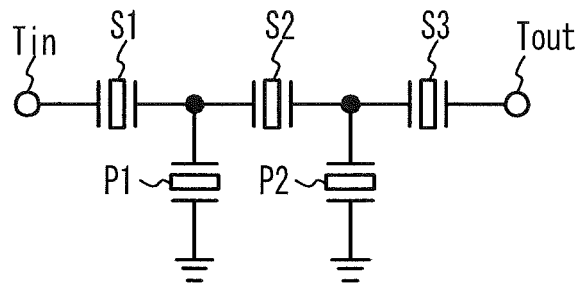
FIG. 21A and FIG. 21B are circuit diagrams of filters in accordance with a fourth embodiment and a first variation of the fourth embodiment.

FIG. 21A is a circuit diagram of a filter in accordance with a fourth embodiment. As illustrated in FIG. 21A, one or more series resonators S1 through S3 are connected in series between the input terminal Tin and the output terminal Tout. One or more parallel resonators P1 and P2 are connected in parallel between the input terminal Tin and the output terminal Tout. At least one of the series resonators S1 through S3 and one or more parallel resonators P1 and P2 may be the acoustic wave resonator of the third embodiment. The number of resonators in the ladder-type filter is freely selected.

First Variation of the Fourth Embodiment

Figure 21B:
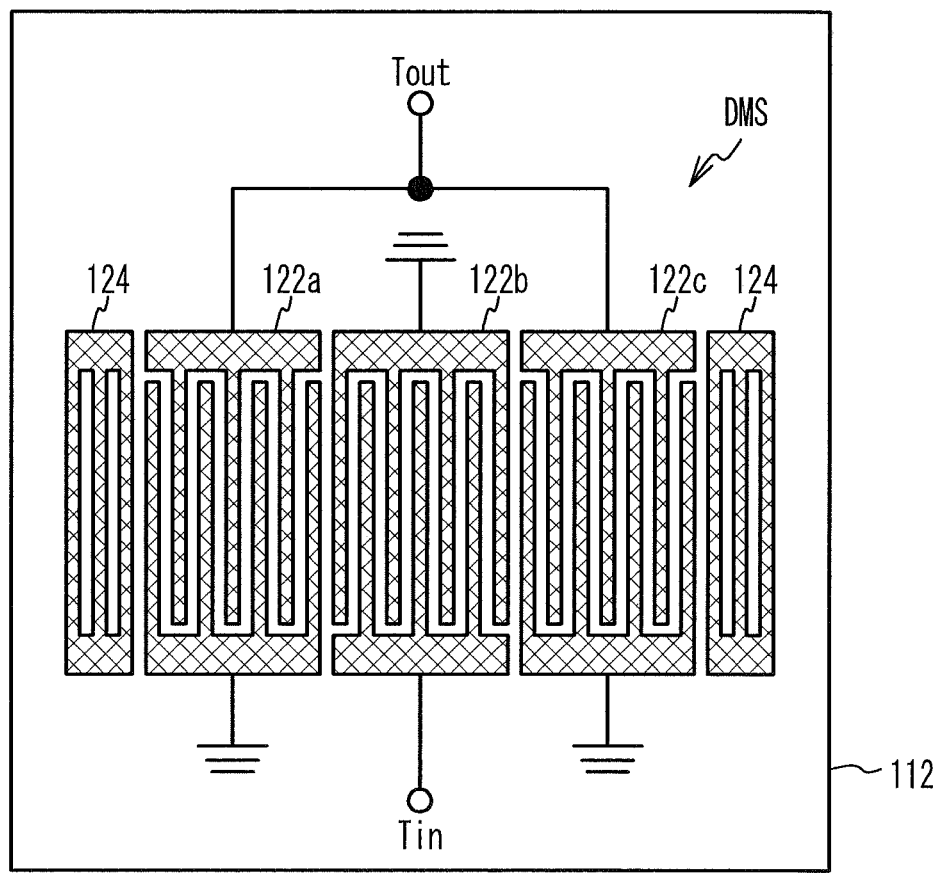

FIG. 21B is a plan view of a filter in accordance with a first variation of the fourth embodiment. As illustrated in FIG. 21B, a multimode type filter DMS includes IDTs 122a through 122c and the reflectors 124. The IDTs 122a through 122c and the reflectors 124 are located on the piezoelectric substrate 112. The IDTs 122a through 122c are arranged in the propagation direction of the surface acoustic wave. The reflectors 124 are located at the outer sides of IDTs 122a through 122c. A first end of the IDT 122b is coupled to the input terminal Tin, and a second end of the IDT 122b is coupled to a ground terminal. A first end of the IDT 122a and a first end of the IDT 122c are commonly coupled to the output terminal Tout. A second end of the IDT 122a and a second end of the IDT 122c are coupled to ground terminals. The structure of the acoustic wave resonator of the third embodiment can be adopted to the multimode type filter DMS.

Second Variation of the Fourth Embodiment

Figure 21C:
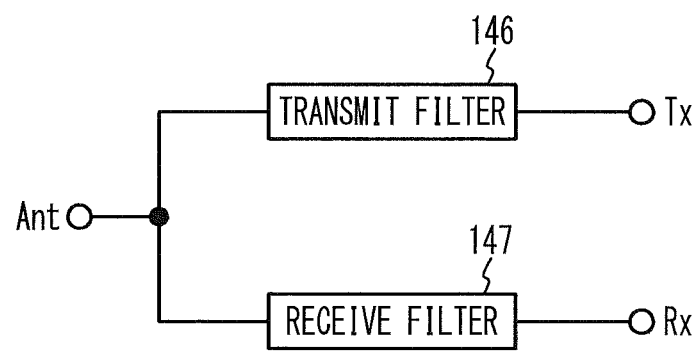
FIG. 21C is a circuit diagram of a duplexer in accordance with a second variation of the fourth embodiment.

FIG. 21C is a circuit diagram of a duplexer in accordance with a second variation of the fourth embodiment. As illustrated in FIG. 21C, a transmit filter 146 is connected between the common terminal Ant and the transmit terminal Tx. A receive filter 147 is connected between the common terminal Ant and the receive terminal Rx. The transmit filter 146 transmits, as transmission signals, signals in the transmit band to the common terminal Ant among high-frequency signals input from the transmit terminal Tx, and suppresses signals with other frequencies. The receive filter 147 transmits, as reception signals, signals in the receive band to the receive terminal Rx among high-frequency signals input from the common terminal Ant, and suppresses signals with other frequencies. At least one of the transmit filter 146 and the receive filter 147 may be the filter of any one of the fourth embodiment and the variations thereof.

A duplexer is described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. An acoustic wave resonator comprising:
   a support substrate;
   a piezoelectric substrate located on the support substrate;
   a first amorphous layer that is in contact with the support substrate and is mainly composed of one or more constituent elements of the support substrate;
   a second amorphous layer that is in contact with the piezoelectric substrate and the first amorphous layer, is mainly composed of one or more constituent elements of the piezoelectric substrate, and is thinner than the first amorphous layer; and
   a pair of comb-shaped electrodes that is located on an opposite surface of the piezoelectric substrate from the support substrate, each of the pair of comb-shaped electrodes including electrode fingers,
   wherein
   a thickness of the piezoelectric substrate is less than an average pitch of the electrode fingers of one of the pair of comb-shaped electrodes, and a thickness of the second amorphous layer is equal to or less than 0.8 times a thickness of the first amorphous layer.

2. The acoustic wave resonator according to claim 1, wherein
the piezoelectric substrate is a monocrystalline substrate, and
the support substrate is a monocrystalline substrate, a polycrystalline substrate, or a sintered body substrate.

3. The acoustic wave resonator according to claim 2, wherein
the piezoelectric substrate is a lithium tantalite substrate or a lithium niobate substrate, and
the support substrate is a sapphire substrate, a spinel substrate, a silicon substrate, a crystal substrate, a quartz substrate, or an alumina substrate.

4. The acoustic wave resonator according to claim 3, wherein
a total atomic concentration of an element other than oxygen among the one or more constituent elements of the support substrate in the first amorphous layer is higher than a total atomic concentration of an element other than oxygen among the one or more constituent elements of the piezoelectric substrate, and
a total atomic concentration of an element other than oxygen among the one or more constituent elements of the piezoelectric substrate in the second amorphous layer is higher than a total atomic concentration of an element other than oxygen among the one or more constituent elements of the support substrate.

5. The acoustic wave resonator according to claim 1, wherein
the pair of comb-shaped electrodes excites an SH wave.

6. The acoustic wave resonator according to claim 1, wherein
the second amorphous layer is equal to or less than 1 nm.

7. The acoustic wave resonator according to claim 6, wherein
the second amorphous layer is equal to or greater than 0.1 nm.

8. The acoustic wave resonator according to claim 7, wherein
the first amorphous layer is equal to or less than 5 nm and is equal or greater than 0.5 nm.

9. A filter comprising:
an acoustic wave resonator including:
a support substrate,
a piezoelectric substrate located on the support substrate,
a first amorphous layer that is in contact with the support substrate and is mainly composed of one or more constituent elements of the support substrate,
a second amorphous layer that is in contact with the piezoelectric substrate and the first amorphous layer, is mainly composed of one or more constituent elements of the piezoelectric substrate, and is thinner than the first amorphous layer, and
a pair of comb-shaped electrodes that is located on an opposite surface of the piezoelectric substrate from the support substrate, each of the pair of comb-shaped electrodes including electrode fingers,
wherein
a thickness of the piezoelectric substrate is less than an average pitch of the electrode fingers of one of the pair of comb-shaped electrodes, and
a thickness of the second amorphous layer is equal to or less than 0.8 times a thickness of the first amorphous layer.

10. A multiplexer comprising:
a filter including an acoustic wave resonator, wherein
the acoustic wave resonator includes:
a support substrate,
a piezoelectric substrate located on the support substrate,
a first amorphous layer that is in contact with the support substrate and is mainly composed of one or more constituent elements of the support substrate,
a second amorphous layer that is in contact with the piezoelectric substrate and the first amorphous layer, is mainly composed of one or more constituent elements of the piezoelectric substrate, and is thinner than the first amorphous layer, and
a pair of comb-shaped electrodes that is located on an opposite surface of the piezoelectric substrate from the support substrate, each of the pair of comb-shaped electrodes including electrode fingers,
wherein
a thickness of the piezoelectric substrate is less than an average pitch of the electrode fingers of one of the pair of comb-shaped electrodes, and
a thickness of the second amorphous layer is equal to or less than 0.8 times a thickness of the first amorphous layer.

* * * * *